(12) United States Patent
Ikeyama

(10) Patent No.: US 12,733,228 B2
(45) Date of Patent: Sep. 8, 2026

(54) NITRIDE SEMICONDUCTOR DEVICE AND METHOD OF MANUFACTURING NITRIDE SEMICONDUCTOR DEVICE

(71) Applicants: DENSO CORPORATION, Kariya City (JP); TOYOTA JIDOSHA KABUSHIKI KAISHA, Toyota (JP); MIRISE Technologies Corporation, Nisshin (JP)

(72) Inventor: Kazuki Ikeyama, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 398 days.

(21) Appl. No.: 18/539,610

(22) Filed: Dec. 14, 2023

(65) Prior Publication Data

US 2024/0304674 A1 Sep. 12, 2024

(30) Foreign Application Priority Data

Mar. 8, 2023 (JP) ................................ 2023-035666

(51) Int. Cl.
*H10D 62/85* (2025.01)
*H10D 30/01* (2025.01)
(Continued)

(52) U.S. Cl.
CPC ..... *H10D 62/8503* (2025.01); *H10D 30/0291* (2025.01); *H10D 30/66* (2025.01); *H10D 62/393* (2025.01)

(58) Field of Classification Search
CPC . H10D 62/8503; H10D 30/0291; H10D 30/66
See application file for complete search history.

(56) References Cited

U.S. PATENT DOCUMENTS

2014/0225122 A1 8/2014 Takeya et al.
2014/0291756 A1 10/2014 Oka
(Continued)

FOREIGN PATENT DOCUMENTS

JP 5289818 B2 9/2013
JP 5682098 B2 3/2015
(Continued)

OTHER PUBLICATIONS

Shibata, D. et al., 1.7 kV / 1.0 mΩcm2 Normally-off Vertical GaN Transistor on GaN substrate with Regrown p-GaN/AlGaN/GaN Semipolar Gate Structure, IEEE International Electron Devices Meeting (IEDM), 2016, p. 10.1.1-10.1.4.
(Continued)

*Primary Examiner* — Peter M Albrecht
(74) *Attorney, Agent, or Firm* — Posz Law Group, PLC

(57) ABSTRACT

A nitride semiconductor device includes: a conductive layer; a protruding region of a nitride semiconductor provided on at least a part of an upper surface of the conductive layer; and an n-type drift layer provided above the conductive layer. The drift layer includes a tapered region having an upward tapered shape above the protruding region. The nitride semiconductor device further includes a p-type body layer adjacent to the tapered region of the drift layer. The drift layer and the body layer are an epitaxial layer.

12 Claims, 29 Drawing Sheets

(51) Int. Cl.
*H10D 30/66* (2025.01)
*H10D 62/17* (2025.01)

(56) References Cited

U.S. PATENT DOCUMENTS

| | | | | |
|---|---|---|---|---|
| 2015/0263157 | A1 | 9/2015 | Fujimoto | |
| 2017/0278719 | A1 | 9/2017 | Fujii et al. | |
| 2018/0102405 | A1 | 4/2018 | Kawakami et al. | |
| 2018/0182621 | A1 | 6/2018 | Yamada et al. | |
| 2018/0350965 | A1 | 12/2018 | Shibata et al. | |
| 2019/0058040 | A1 | 2/2019 | Hayashida et al. | |
| 2021/0151595 | A1 * | 5/2021 | Park .................. | H10D 62/8503 |
| 2022/0093475 | A1 | 3/2022 | Yokoyama et al. | |

FOREIGN PATENT DOCUMENTS

| | | |
|---|---|---|
| JP | 2021-090015 A | 6/2021 |
| JP | 2022-060765 A | 4/2022 |

OTHER PUBLICATIONS

Alugubelli, S. et al., Determination of electronic band structure by electron holography of etched-and-regrown interfaces in GaN p-i-n diodes, Appl. Phys. Lett., Nov. 11, 2019, vol. 115, 201602.
Mantach, R. et al., Semipolar (10-11) GaN growth on silicon-oninsulator substrates: Defect reduction and meltback etching suppression, J. Appl. Phys., Jan. 16, 2019, vol. 125, 035703.
Hiramatsu, K. et al., Fabrication and characterization of low defect density GaN using facet-controlled epitaxial lateral overgrowth (FACELO), Journal of Crystal Growth, 2000, pp. 316-326, vol. 221.
Filho, W. et al., AION gate dielectric and gate trench cleaning for improved reliability of vertical GaN MOSFETs, CIPS, 2022, pp. 414-418.

* cited by examiner 4
24a
24
36
34
30
32
15(n++)
14
p-
p-
p-
10
13b
13
13a
13c
n-
112
n+
n+
42a
42
103
n+
102
100
101
14a
12a
112b
22

4
24a
24
36
34
32
30
15(n++)
14
p⁻
p⁻
p⁻
10
13b
13
13a
13c
n⁻
112
n+
n+
42a
42
n+
103
102
100
101
14a
12a
112b
22

NITRIDE SEMICONDUCTOR DEVICE AND METHOD OF MANUFACTURING NITRIDE SEMICONDUCTOR DEVICE

CROSS REFERENCE TO RELATED APPLICATION

This application is based on Japanese Patent Application No. 2023-035666 filed on Mar. 8, 2023, the disclosure of which is incorporated herein by reference.

TECHNICAL FIELD

The present disclosure relates to a nitride semiconductor device and a manufacturing method of a nitride semiconductor device.

BACKGROUND

A nitride semiconductor device has a p-type body layer partially provided on an n-type drift layer. To form the p-type body layer, either an ion implantation technique or a re-epitaxial growth technique may be selected.

SUMMARY

A nitride semiconductor device includes: a conductive layer; a protruding region of a nitride semiconductor provided on at least a part of an upper surface of the conductive layer; an n-type drift layer provided above the conductive layer, the drift layer including a tapered region having an upward tapered shape above the protruding region; and a p-type body layer adjacent to the tapered region of the drift layer. The drift layer and the body layer are an epitaxial layer.

DETAILED DESCRIPTION

Figure 1:
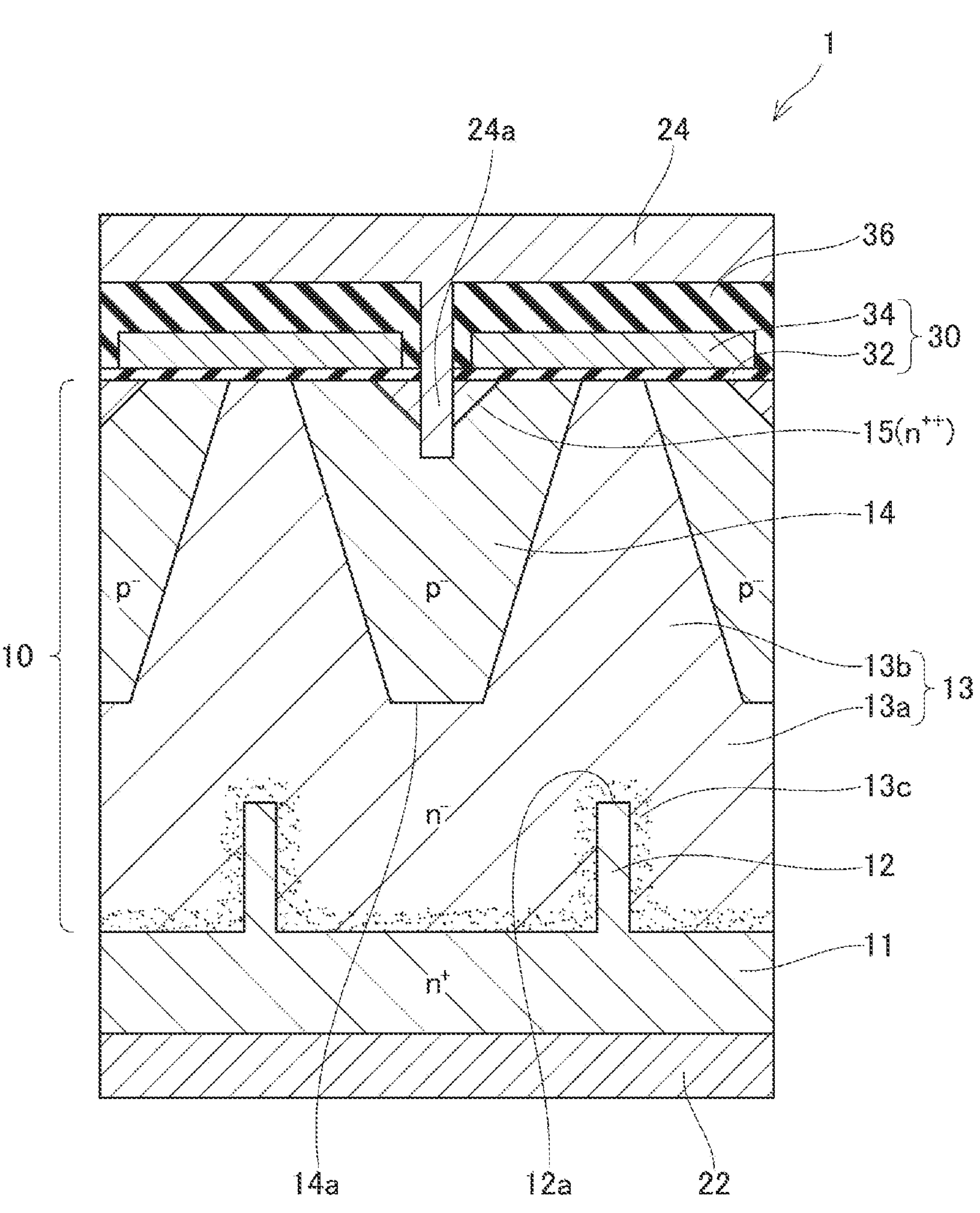
FIG. 1 is a cross-sectional view illustrating a nitride semiconductor device according to an embodiment.

A nitride semiconductor device has a p-type body layer partially provided on an n-type drift layer. To form the p-type body layer, either an ion implantation technique or a re-epitaxial growth technique may be selected. However, it is difficult to form a highly active p-type diffusion region in a semiconductor layer made of a nitride semiconductor by using an ion implantation technique. For this reason, the present disclosure proposes techniques for forming a body layer on a drift layer using a re-epitaxial growth technique.

According to the study by the present inventor, it is found that the initial layer of the re-epitaxial-layer contains a large amount of impurities such as silicon, oxygen, and carbon, and becomes a high-concentration n-type region. The presence of such a high-concentration n-type region may reduce the breakdown voltage of the nitride semiconductor device. The present specification provides a nitride semiconductor device in which a decrease in breakdown voltage is suppressed and a method for manufacturing the nitride semiconductor device.

A nitride semiconductor device includes: a conductive layer; a protruding region of a nitride semiconductor provided on at least a part of an upper surface of the conductive layer; an n-type drift layer provided above the conductive layer, the drift layer including a tapered region having an upward tapered shape above the protruding region; and a p-type body layer adjacent to the tapered region of the drift layer. The conductive layer may be a semiconductor containing impurities or a metal. The drift layer and the body layer may be an epitaxial layer. In this nitride semiconductor device, since the drift layer and the body layer are formed of the epitaxial layer, a high-concentration n-type region formed in an initial layer, when the epitaxial layer is re-epitaxially grown, is formed at least around the protruding region. In this nitride semiconductor device, since the drift layer is provided above the protruding region, the drift layer is interposed between the high-concentration n-type region and the p-type body layer. Further, the drift layer includes the tapered region above the protruding region. Therefore, the body layer adjacent to the tapered region is inclined in a direction away from the protruding region. As described above, the nitride semiconductor device disclosed in the present specification has a structure in which a decrease in breakdown voltage is suppressed because a distance is ensured between the high-concentration n-type region and the p-type body layer.

A method of manufacturing a nitride semiconductor device includes: a protruding region forming step of forming a protruding region by etching an upper surface of an n-type nitride semiconductor layer; a drift layer forming step of forming an n-type drift layer having an n-type impurity concentration lower than that of the nitride semiconductor layer by crystal growth from the upper surface of the nitride semiconductor layer, the drift layer being provided above the nitride semiconductor layer and including a tapered region having an upward tapered shape above the protruding region; and a body layer forming step of forming a p-type body layer by crystal growth from an upper surface of the drift layer, the body layer being adjacent to the tapered region of the drift layer. According to this manufacturing method, a nitride semiconductor device having a structure in which a decrease in breakdown voltage is suppressed can be manufactured.

A method of manufacturing a nitride semiconductor device includes: forming a mask layer on an upper surface of a nitride semiconductor layer, the mask layer having an opening; forming a protruding region by crystal growth from the upper surface of the nitride semiconductor layer exposed from the opening of the mask layer; removing the mask layer; forming an n-type drift layer by crystal growth from the upper surface of the nitride semiconductor layer, the drift layer being provided above the nitride semiconductor layer and including a tapered region having an upward tapered shape above the protruding region; and forming a p-type body layer by crystal growth from an upper surface of the drift layer, the body layer being adjacent to the tapered region of the drift layer. According to this manufacturing method, a nitride semiconductor device having a structure in which a decrease in breakdown voltage is suppressed can be manufactured.

A method of manufacturing a nitride semiconductor device includes: forming a mask layer on an upper surface of a nitride semiconductor layer, the mask layer having an opening; forming a protruding region by crystal growth from the upper surface of the nitride semiconductor layer exposed from the opening of the mask layer; forming an n-type drift layer by crystal growth from the protruding region, the drift layer being provided above the nitride semiconductor layer and including a tapered region having an upward tapered shape above the protruding region; and forming a p-type body layer by crystal growth from an upper surface of the drift layer, the body layer being adjacent to the tapered region of the drift layer. According to this manufacturing method, a nitride semiconductor device having a structure in which a decrease in breakdown voltage is suppressed can be manufactured.

Hereinafter, a semiconductor device and a manufacturing method thereof will be described with reference to the drawings, to which the technology disclosed in the present specification is applied. In the following description, components that are substantially common throughout the drawings are designated by a common reference numeral, and the description thereof may be omitted. In addition, for the purpose of clarifying the illustration, only a part of the repeatedly arranged structure is denoted by a reference numeral.

As used herein, a "nitride semiconductor" is a compound defined by $In_XAl_YGa_{1-X-Y}N$ (where $0 \le X \le 1$, $0 \le Y \le 1$).

First Embodiment

As shown in FIG. 1, a nitride semiconductor device 1 includes an $n^+$-type nitride semiconductor layer 11, a protruding region 12 of an $n^+$-type nitride semiconductor, a drift layer 13 of an $n^-$-type nitride semiconductor, a body layer 14 of a $p^-$-type nitride semiconductor, and a source layer 15 of an $n^{++}$-type nitride semiconductor, each of which is made of gallium nitride (GaN). The drift layer 13, the body layer 14, and the source layer 15 are formed from the upper surface of the nitride semiconductor layer 11 using a re-epitaxial growth technique as described in a manufacturing method to be described later, and are also referred to as an epitaxial layer 10.

The nitride semiconductor layer 11 is a GaN free-standing substrate. The nitride semiconductor layer 11 may be a base substrate from the upper surface of which a nitride semiconductor can be epitaxially grown. The nitride semiconductor layer 11 may be, for example, a GaN-on-Si substrate, a GaN-on-SiC substrate, or a GaN-on-sapphire substrate instead of the GaN free-standing substrate. The n-type impurity concentration of the nitride semiconductor layer 11 is not particularly limited, but may be, for example, $1 \times 10^{17}$ to $1 \times 10^{22}$ $cm^{-3}$. The nitride semiconductor layer 11 is also referred to as a drain layer because of its function in the nitride semiconductor device 1. The nitride semiconductor layer 11 is an example of a conductive layer.

The protruding region 12 is provided on at least a part of the upper surface of the nitride semiconductor layer 11, and protrudes upward from the upper surface of the nitride semiconductor layer 11. The protruding region 12 is formed by etching the upper surface of the nitride semiconductor layer 11 as described in a manufacturing method to be described later, and is also a part of the nitride semiconductor layer 11. The protruding region 12 may extend along one direction or may be dispersed in an island shape in a plan view. The protruding region 12 may be made of a nitride semiconductor, and its conductivity type and impurity concentration are not particularly limited. For example, the protruding region 12 may be a p-type nitride semiconductor. In addition, the protruding region 12 may not be formed of a single layer. For example, the protruding region 12 may be configured by stacking plural layers having different impurity concentrations, may be configured by stacking layers of different conductivity types, or may be configured by stacking layers including an undoped layer.

The drift layer 13 covers the protruding region 12 and is provided above the nitride semiconductor layer 11. The n-type impurity concentration of the drift layer 13 is lower than the n-type impurity concentration of the nitride semiconductor layer 11. The n-type impurity concentration of the drift layer 13 is not particularly limited, but may be, for example, $1\times10^{15}$ to $1\times10^{18}$ $cm^{-3}$.

The drift layer 13 has a flat region 13*a* and a tapered region 13*b*. The flat region 13*a* has a planar shape extending on the nitride semiconductor layer 11 in the plane direction of the epitaxial layer 10, that is, parallel to the upper surface of the nitride semiconductor layer 11. In this example, the flat region 13*a* is in contact with the upper surface of the nitride semiconductor layer 11 and the top surface and the side surface of the protruding region 12, and has a predetermined thickness. The tapered region 13*b* is provided in a part of the upper surface of the flat region 13*a*, and has a shape tapered upward above the protruding region 12. The tapered region 13*b* extends to the upper surface of the epitaxial layer 10. The side surface of the tapered region 13*b* is continuously inclined from the position in contact with the upper surface of the flat region 13*a* to the position of the upper surface of the epitaxial layer 10. Thus, the tapered region 13*b* is configured to have a trapezoidal cross section.

A high-concentration n-type region 13*c* is present in a part of the drift layer 13 in contact with the upper surface of the nitride semiconductor layer 11 and the top surface and the side surface of the protruding region 12. Alternatively, it can be said that the high-concentration n-type region 13*c* is interposed between the drift layer 13, the upper surface of the nitride semiconductor layer 11 and the top surface and the side surface of the protruding region 12. As will be described later in a manufacturing method, the high-concentration n-type region 13*c* is an initial layer at the time of re-epitaxial growth.

The body layer 14 is provided on the drift layer 13. More specifically, the body layer 14 is disposed on the flat region 13*a* of the drift layer 13 and adjacent to the side surface of the tapered region 13*b* of the drift layer 13. A part of the body layer 14 is disposed at a position exposed to the upper surface of the epitaxial layer 10. Thus, the body layer 14 has a downwardly tapered shape. The lower end 14*a* of the body layer 14 is located above the upper end 12*a* of the protruding region 12. Instead of this example, the lower end 14*a* of the body layer 14 may be provided below the upper end 12*a* of the protruding region 12. That is, the body layer 14 may be configured such that the lower end 14*a* thereof enters a region between the protruding regions 12 adjacent to each other.

The source layer 15 is provided on the body layer 14, and is disposed at a position exposed to the upper surface of the epitaxial layer 10. The source layer 15 is separated from the drift layer 13 by the body layer 14.

The nitride semiconductor device 1 further includes a drain electrode 22, a source electrode 24, and a planar insulated gate 30.

The drain electrode 22 is provided in contact with the lower surface of the nitride semiconductor layer 11, and is in ohmic contact with the nitride semiconductor layer 11. The source electrode 24 is provided above the epitaxial layer 10 so as to cover the insulated gate 30. The source electrode 24 has a contact portion 24*a* that penetrates the source layer 15 from the upper surface of the epitaxial layer 10 and reaches the body layer 14. The contact portion 24*a* of the source electrode 24 is in ohmic contact with the body layer 14 and the source layer 15.

The insulated gate 30 is provided on a part of the upper surface of the epitaxial layer 10, and includes a gate insulating film 32 and a gate electrode 34. The gate insulating film 32 is in contact with the upper surface of the epitaxial layer 10. The gate electrode 34 faces the upper surface of the epitaxial layer 10 via the gate insulating film 32. The gate electrode 34 is provided to face the body layer 14 separating the tapered region 13*b* of the drift layer 13 and the source layer 15 via the gate insulating film 32. The gate electrode 34 is insulated from the source electrode 24 by the interlayer insulating film 36.

Next, the operation of the nitride semiconductor device 1 will be described. In use, for example, a voltage is applied such that the drain electrode 22 is more positive than the source electrode 24. When a positive voltage higher than the gate threshold voltage is applied to the gate electrode 34, an inversion layer is formed in the body layer 14 separating the tapered region 13*b* of the drift layer 13 and the source layer 15, and the nitride semiconductor device 1 is turned on. At this time, electrons flow into the tapered region 13*b* from the source layer 15 via the inversion layer. The electrons flowing into the tapered region 13*b* flow through the tapered region 13*b* in the vertical direction toward the nitride semiconductor layer 11. As a result, the drain electrode 22 and the source electrodes 24 become conductive.

When the gate electrode 34 is set to the same potential as the source electrode 24, the inversion layer disappears and the nitride semiconductor device 1 is turned off. At this time, a depletion layer extends from the pn junction surface between the drift layer 13 and the body layer 14 into the drift layer 13. The tapered region 13*b* of the drift layer 13 is substantially fully depleted. In the nitride semiconductor device 1, the high-concentration n-type region 13*c* is formed at a position away from the pn junction surface between the drift layer 13 and the body layer 14. In the nitride semiconductor device 1, since the drift layer 13 is provided so as to cover the upper surface of the nitride semiconductor layer 11 and the top surface and the side surface of the protruding region 12, the drift layer 13 having a low n-type impurity concentration is interposed between the high-concentration n-type region 13*c* and the body layer 14. Further, the drift layer 13 includes the tapered region 13*b* above the protruding region 12. Therefore, the body layer 14 adjacent to the tapered region 13*b* is inclined in a direction away from the protruding region 12. As described above, in the nitride semiconductor device 1, a distance is secured between the high-concentration n-type region 13*c* and the body layer 14, so that the extension of the depletion layer extending from the pn junction surface between the drift layer 13 and the body layer 14 is suppressed from being inhibited. As a result, the nitride semiconductor device 1 can have a high breakdown voltage.

Manufacturing Method

Figure 2:
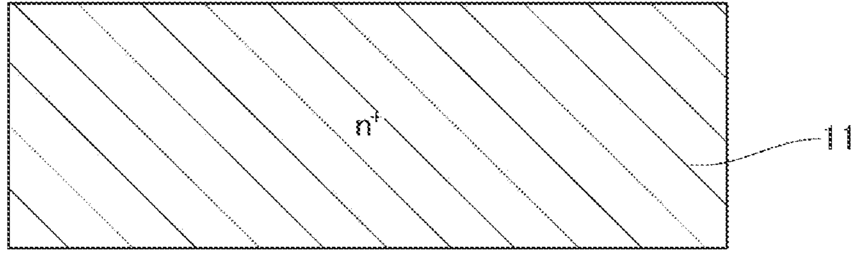
FIG. 2 is a cross-sectional view illustrating a step of manufacturing the nitride semiconductor device of FIG. 1.
Figure 3:
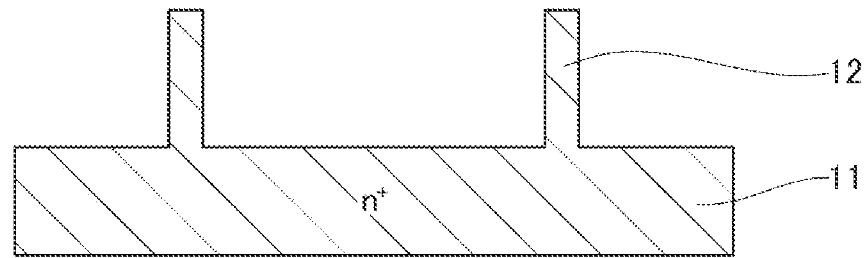
FIG. 3 is a cross-sectional view illustrating a step of manufacturing the nitride semiconductor device of FIG. 1.

First, as shown in FIG. 2, a nitride semiconductor layer 11 which is a GaN free-standing substrate is prepared. Next, as shown in FIG. 3, a part of the upper surface of the nitride semiconductor layer 11 is removed using an etching technique to form a protruding region 12.

Figure 4:
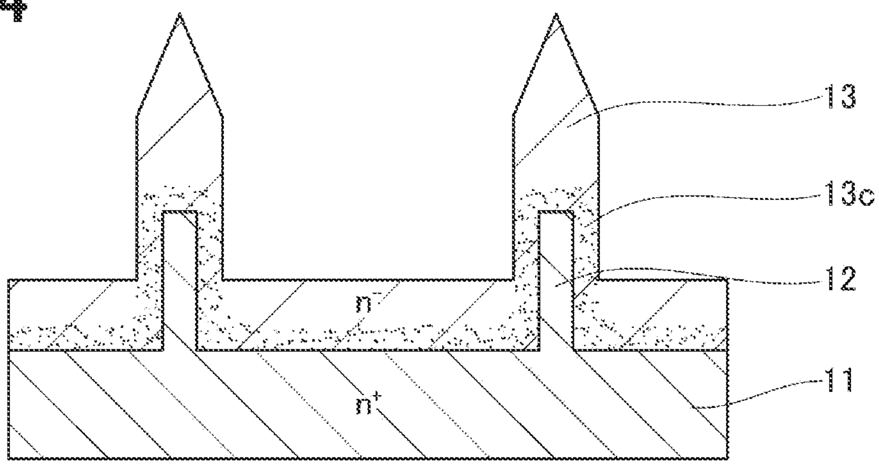
FIG. 4 is a cross-sectional view illustrating a step of manufacturing the nitride semiconductor device of FIG. 1.
Figure 5:
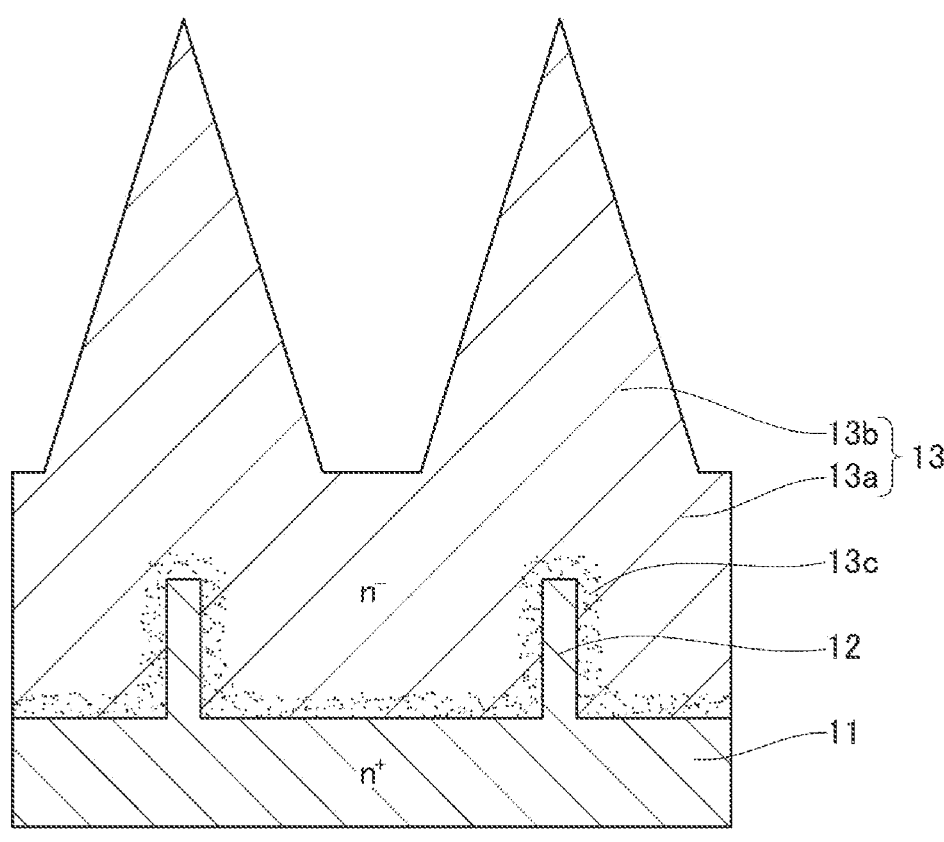
FIG. 5 is a cross-sectional view illustrating a step of manufacturing the nitride semiconductor device of FIG. 1.

Next, as shown in FIGS. 4 and 5, the drift layer 13 is crystal-grown from the upper surface of the nitride semiconductor layer 11 and the top surface and the side surface of the protruding region 12 using an epitaxial growth technique. At this time, the tapered region 13*b* can be formed above the protruding region 12 by adjusting the growth temperature, the gas flow rate, the pressure, and the like. In the initial layer of the drift layer 13 which is a re-epitaxial layer, for example, a large amount of impurities such as silicon, oxygen, and carbon are incorporated, and a high-concentration n-type region 13*c* is formed. In this example, the high-concentration n-type region 13*c* is formed in a part of the drift layer 13 in contact with the upper surface of the nitride semiconductor layer 11 and the side surface and the top surface of the protruding region 12. In this example, the drift layer 13 is crystal-grown from the upper surface of the nitride semiconductor layer 11 and the top surface and the side surface of the protruding region 12. However, instead of this example, the drift layer 13 may be crystal-grown after a high-concentration n-type epitaxial layer is grown.

Figure 6:
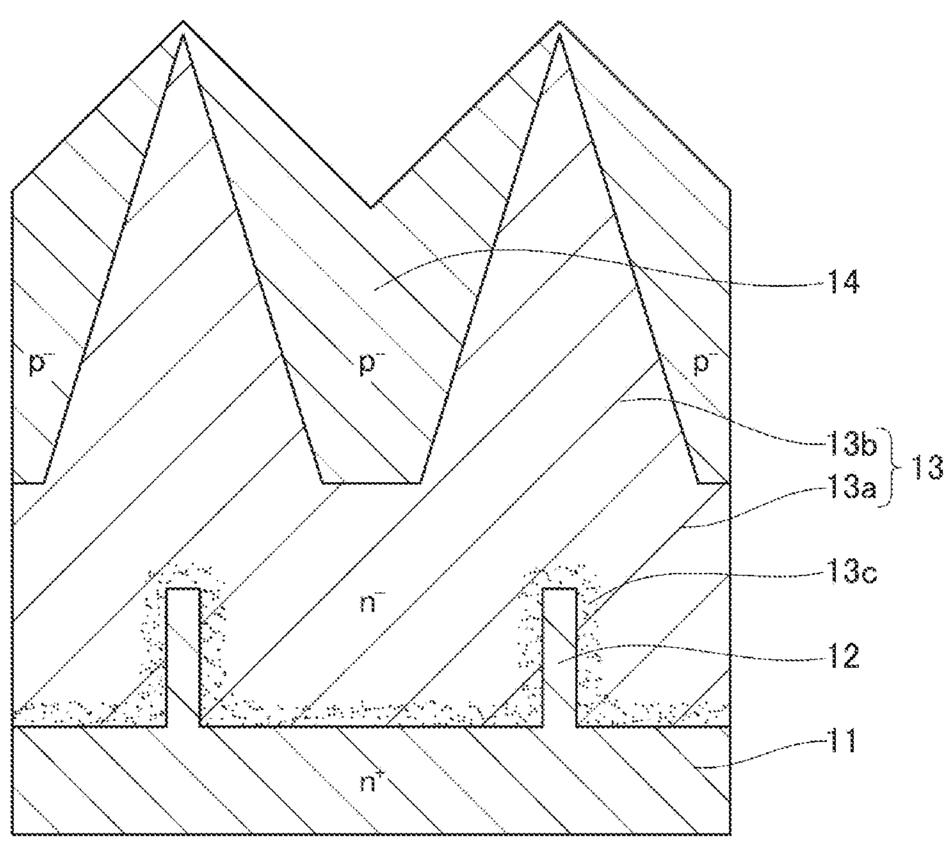
FIG. 6 is a cross-sectional view illustrating a step of manufacturing the nitride semiconductor device of FIG. 1.

Next, as shown in FIG. 6, the body layer 14 is crystal-grown from the upper surface of the drift layer 13 using an epitaxial growth technique. At this time, unevenness corresponding to the shape of the tapered region 13*b* of the drift layer 13 can be formed on the upper surface of the body layer 14 by adjusting the growth temperature, the gas flow rate, the pressure, and the like.

Figure 7:
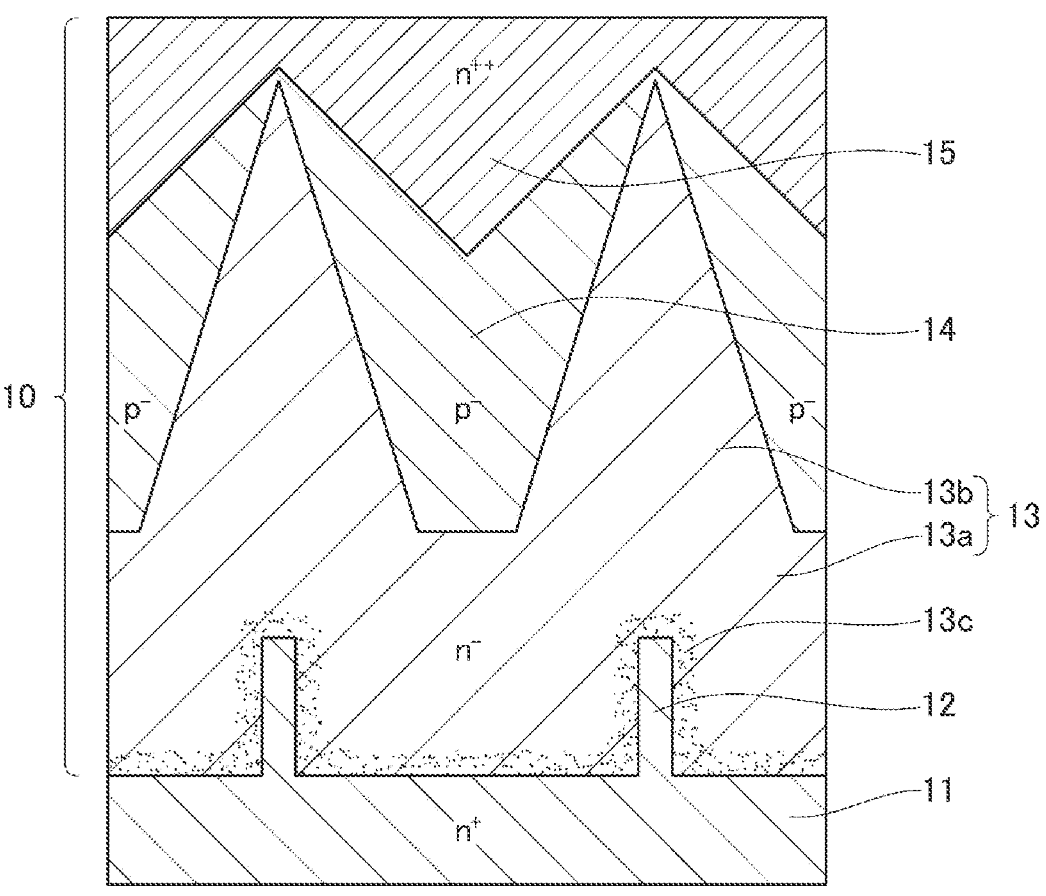
FIG. 7 is a cross-sectional view illustrating a step of manufacturing the nitride semiconductor device of FIG. 1.

Next, as shown in FIG. 7, the source layer 15 is crystal-grown from the upper surface of the body layer 14 using an epitaxial growth technique. At this time, the upper surface of the source layer 15 can be formed flat by adjusting the growth temperature, the gas flow rate, the pressure, and the like. Instead of this example, the source layer 15 may be formed such that irregularities are formed on the upper surface of the source layer 15 by adjusting the growth temperature, the gas flow rate, the pressure, and the like. The drift layer 13, the body layer 14, and the source layer 15 are continuously grown in the same chamber to form the epitaxial layer 10.

Figures 8, 9:
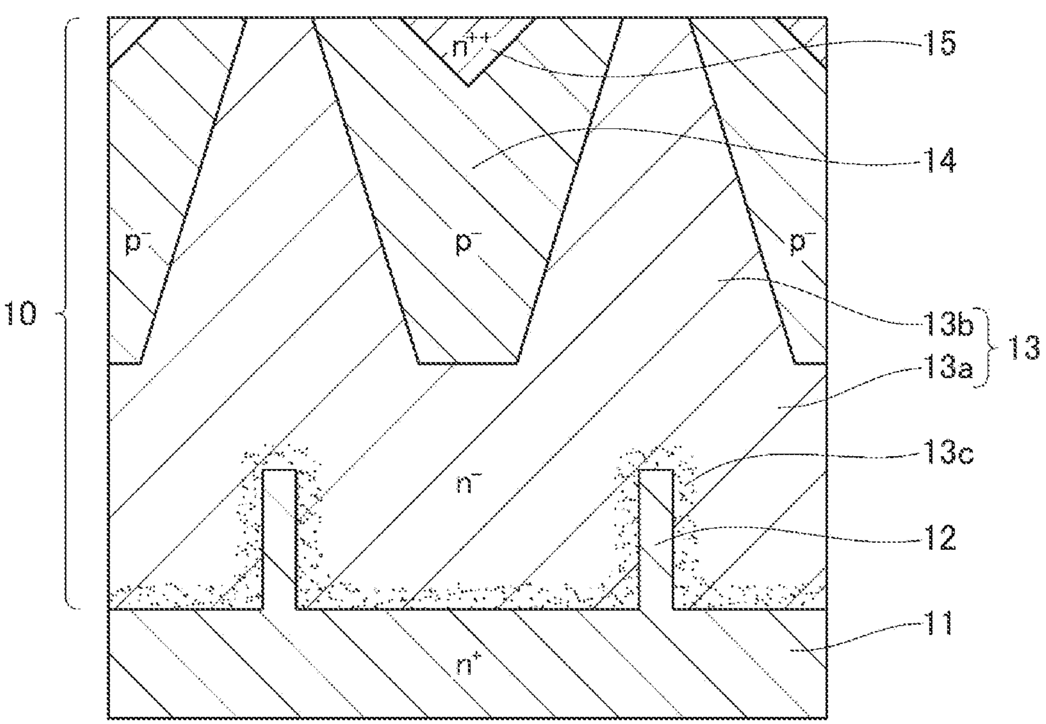
FIG. 8 is a cross-sectional view illustrating a step of manufacturing the nitride semiconductor device of FIG. 1.
FIG. 9 is a cross-sectional view illustrating a step of manufacturing the nitride semiconductor device of FIG. 1.

Next, as shown in FIG. 8, the upper surface of the epitaxial layer 10 is planarized by CMP (Chemical Mechanical Polishing) or anisotropic wet etching to expose the tapered region 13*b* of the drift layer 13.

Next, as shown in FIG. 9, a gate insulating film 32 and a gate electrode 34 are formed on the upper surface of the epitaxial layer 10 using a film forming technique.

Figure 10:
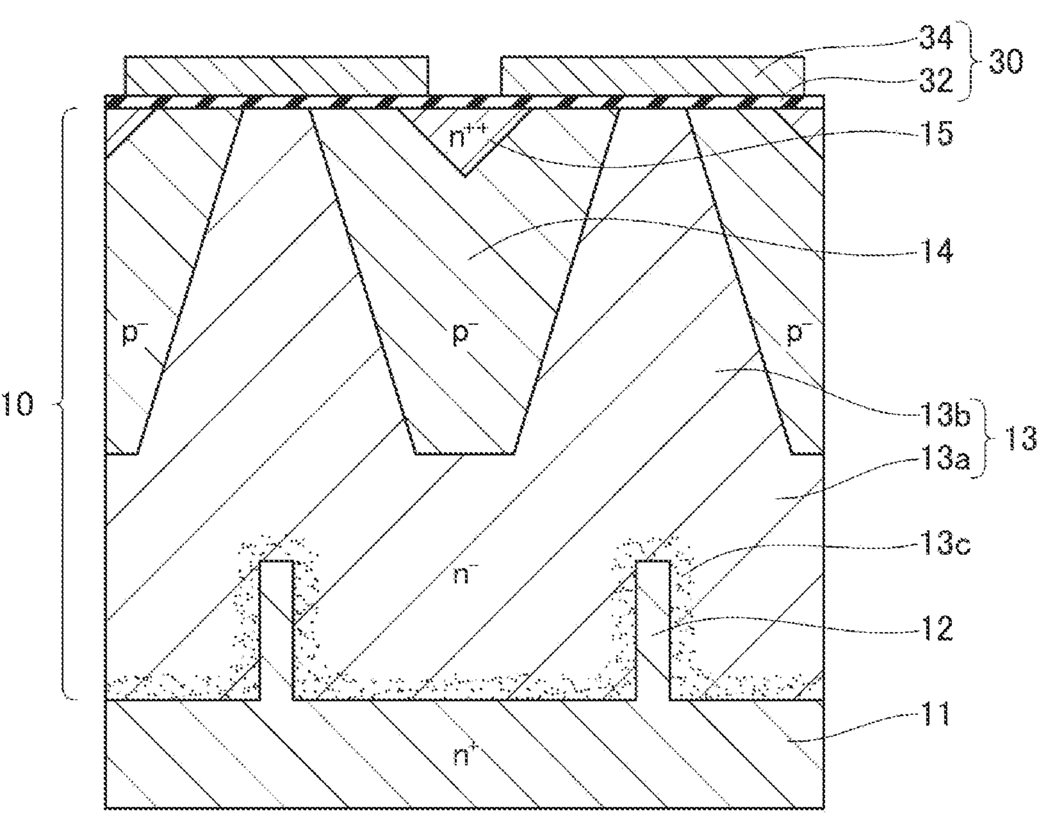
FIG. 10 is a cross-sectional view illustrating a step of manufacturing the nitride semiconductor device of FIG. 1.

Next, as shown in FIG. 10, a part of the gate electrode 34 is removed by using an etching technique to form the insulated gate 30.

Figure 11:
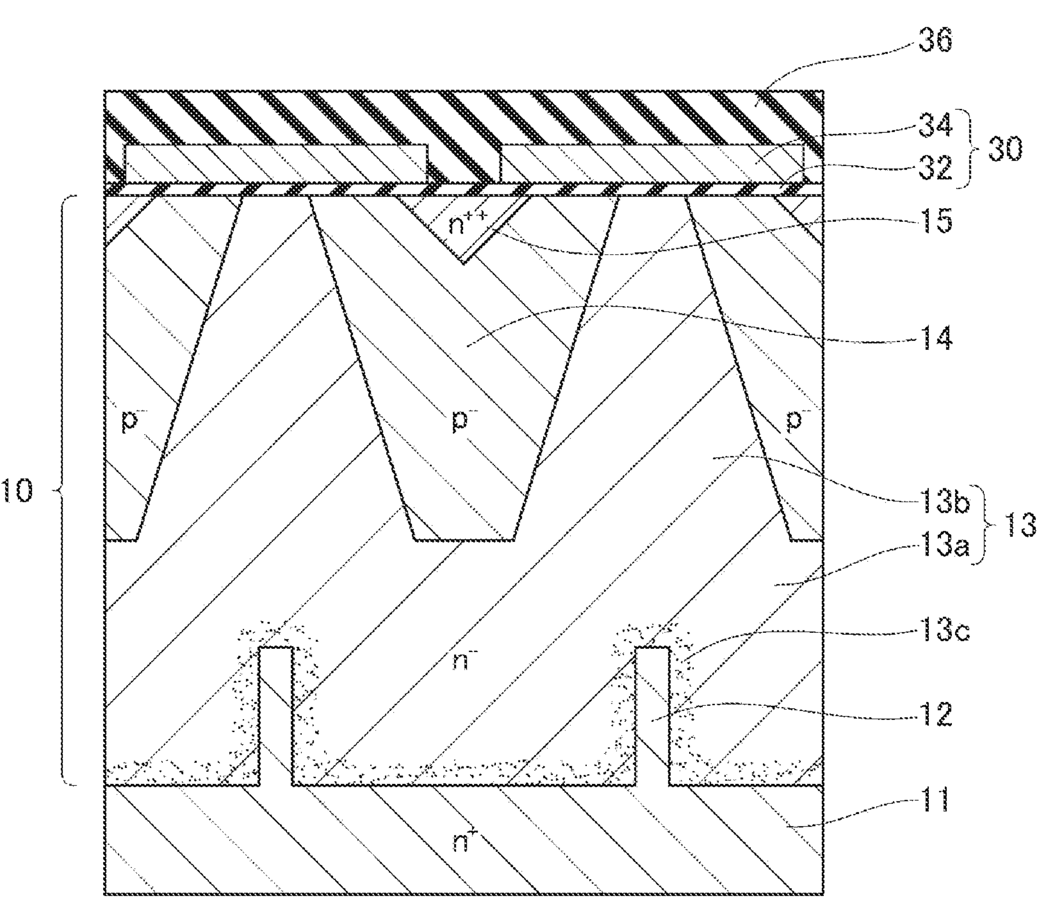
FIG. 11 is a cross-sectional view illustrating a step of manufacturing the nitride semiconductor device of FIG. 1.

Next, as shown in FIG. 11, an interlayer insulating film 36 is formed on the epitaxial layer 10 so as to cover the gate electrode 34 using a film formation technique.

Figure 12:
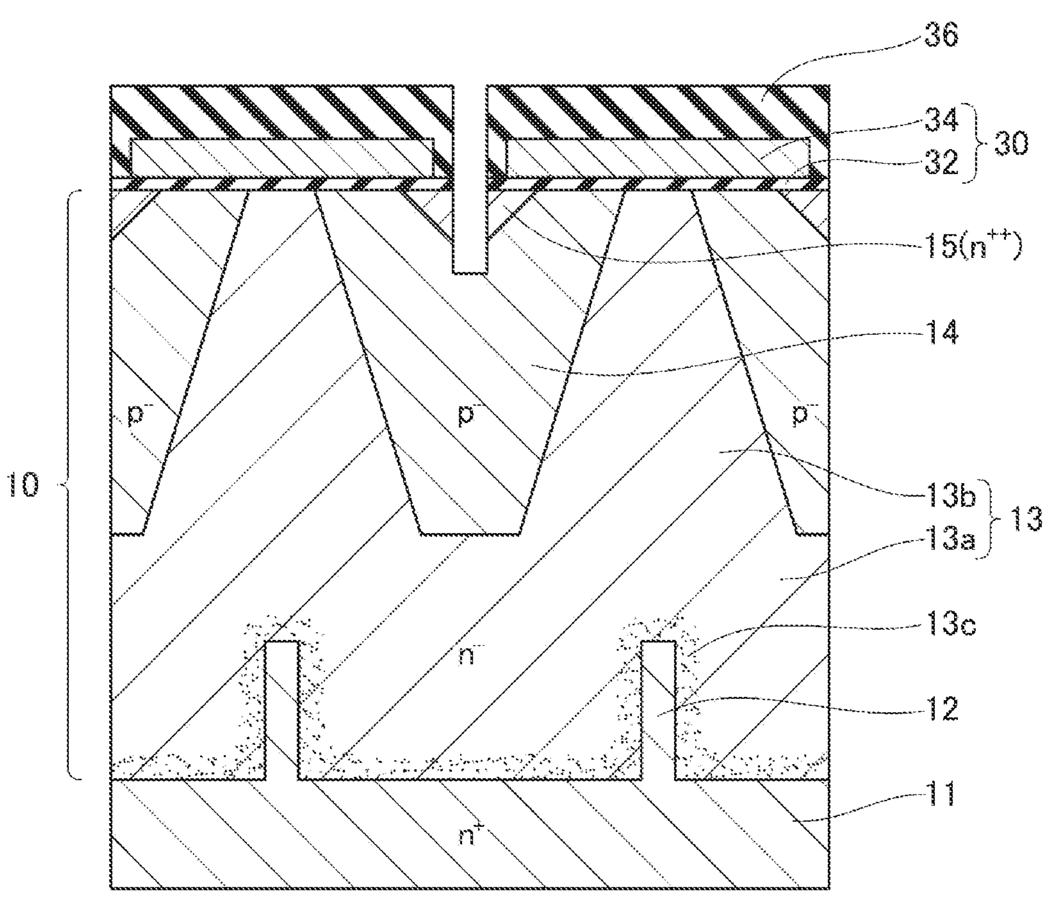
FIG. 12 is a cross-sectional view illustrating a step of manufacturing the nitride semiconductor device of FIG. 1.

Next, as shown in FIG. 12, a part of the interlayer insulating film 36 and the gate insulating film 32 is removed using an etching technique to expose the upper surface of the epitaxial layer 10. Further, a contact hole is formed from the upper surface of the epitaxial layer 10 to the body layer 14 through the source layer 15 by using an etching technique.

Finally, the nitride semiconductor device 1 can be manufactured by forming the drain electrode 22 on the lower surface of the nitride semiconductor layer 11 and forming the source electrode 24 on the upper surface of the epitaxial layer 10.

Modification in Manufacturing Method

Figure 13:
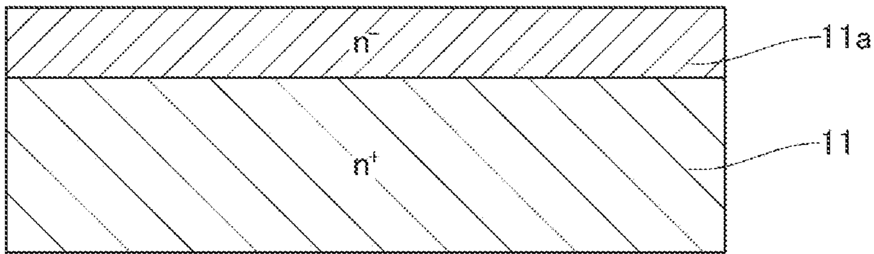
FIG. 13 is a cross-sectional view illustrating a step of manufacturing the nitride semiconductor device of FIG. 1.

First, as shown in FIG. 13, a nitride semiconductor layer 11 which is a GaN free-standing substrate is prepared. Next, a n-type epitaxial layer 11*a* is crystal-grown from the upper surface of the nitride semiconductor layer 11 using an epitaxial growth technique. The n-type impurity concentration of the n-type epitaxial layer 11*a* is lower than the n-type impurity concentration of the nitride semiconductor layer 11. An undoped epitaxial layer may be formed instead of the n-type epitaxial layer 11*a*.

Figure 14:
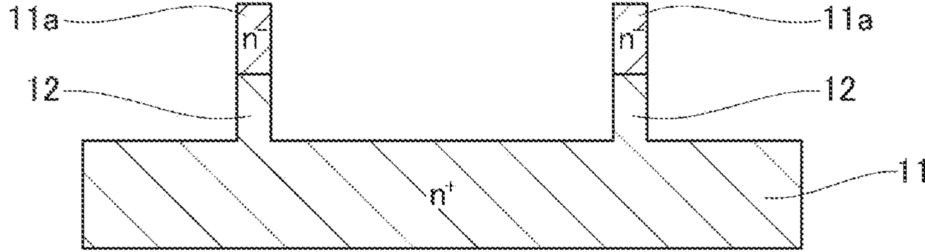
FIG. 14 is a cross-sectional view illustrating a step of manufacturing the nitride semiconductor device of FIG. 1.

Next, as shown in FIG. 14, a part of the n-type epitaxial layer 11*a* and the nitride semiconductor layer 11 is removed by using an etching technique to form the protruding region 12. The protruding region 12 is formed of a stacked body in which a lower side layer having a relatively high n-type impurity concentration and an upper side layer having a relatively low n-type impurity concentration (or an undoped layer) are stacked with each other.

Thereafter, the nitride semiconductor device 1 can be manufactured by performing the steps described with reference to FIGS. 4 to 12. According to this manufacturing method, the n-type impurity contained in the high-concentration n-type region 13*c*, which is an initial layer when the drift layer 13 is crystal-grown (see FIGS. 4 and 5), diffuses into the low-concentration n-type epitaxial layer 11*a* (or undoped layer) of the protruding region 12, and the n-type impurity concentration of the n-type region 13*c* may decrease. Therefore, according to this manufacturing method, the nitride semiconductor device 1 having a higher breakdown voltage can be manufactured.

Second Embodiment

Figure 15:
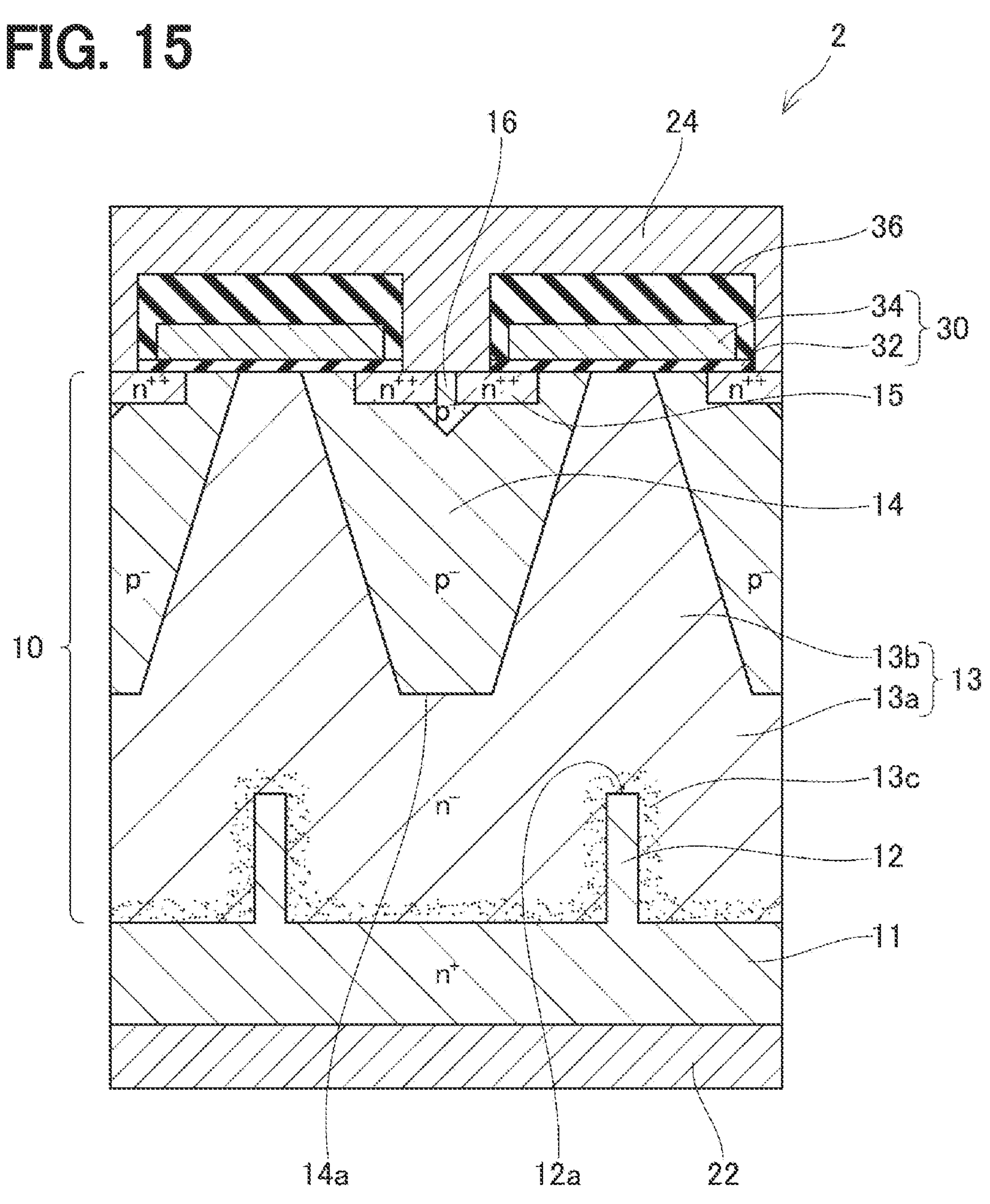
FIG. 15 is a cross-sectional view illustrating a nitride semiconductor device according to an embodiment.

As shown in FIG. 15, a nitride semiconductor device 2 includes a contact layer 16. The contact layer 16 is provided on the body layer 14 and is disposed at a position exposed to the upper surface of the epitaxial layer 10. The p-type impurity concentration of the contact layer 16 is higher than the p-type impurity concentration of the body layer 14. According to such a configuration, the body layer 14 and the source electrode 24 are connected with low contact resistance via the contact layer 16. When the contact layer 16 is provided, the contact portion 24*a* (see FIG. 1) of the source electrode 24 is unnecessary. Like the nitride semiconductor device 1, the nitride semiconductor device 2 can also have a high breakdown voltage.

Figure 16:
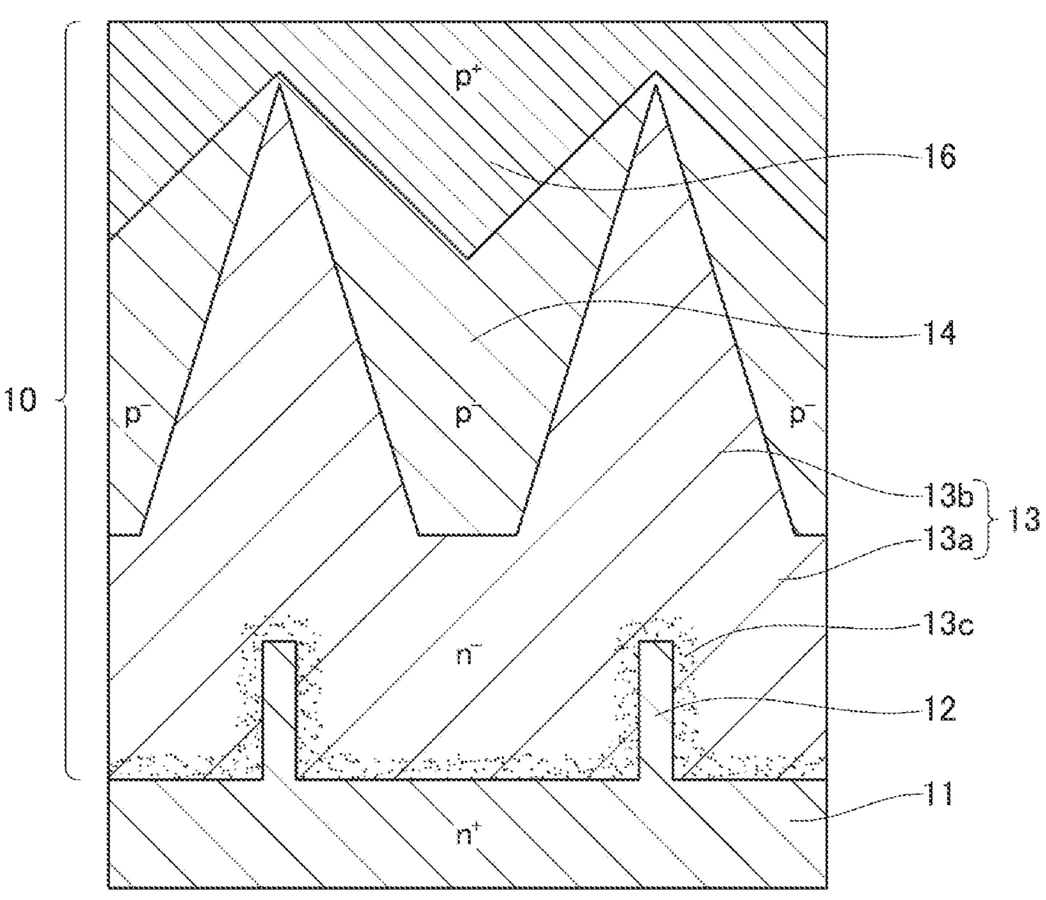
FIG. 16 is a cross-sectional view illustrating a step of manufacturing the nitride semiconductor device of FIG. 15.

The steps up to the formation of the body layer 14 are the same as those of the method for manufacturing the nitride semiconductor device 1 (see FIGS. 2 to 6 and FIGS. 13 and 14). Next, as shown in FIG. 16, the contact layer 16 is crystal-grown from the upper surface of the body layer 14 using an epitaxial growth technique. At this time, the upper surface of the contact layer 16 can be formed flat by adjusting the growth temperature, the gas flow rate, the pressure, and the like. Instead of this example, the contact layer 16 may be formed such that irregularities are formed on the upper surface of the contact layer 16 by adjusting the growth temperature, the gas flow rate, the pressure, and the like. The drift layer 13, the body layer 14, and the contact layer 16 are continuously grown in the same chamber to form the epitaxial layer 10.

Figure 17:
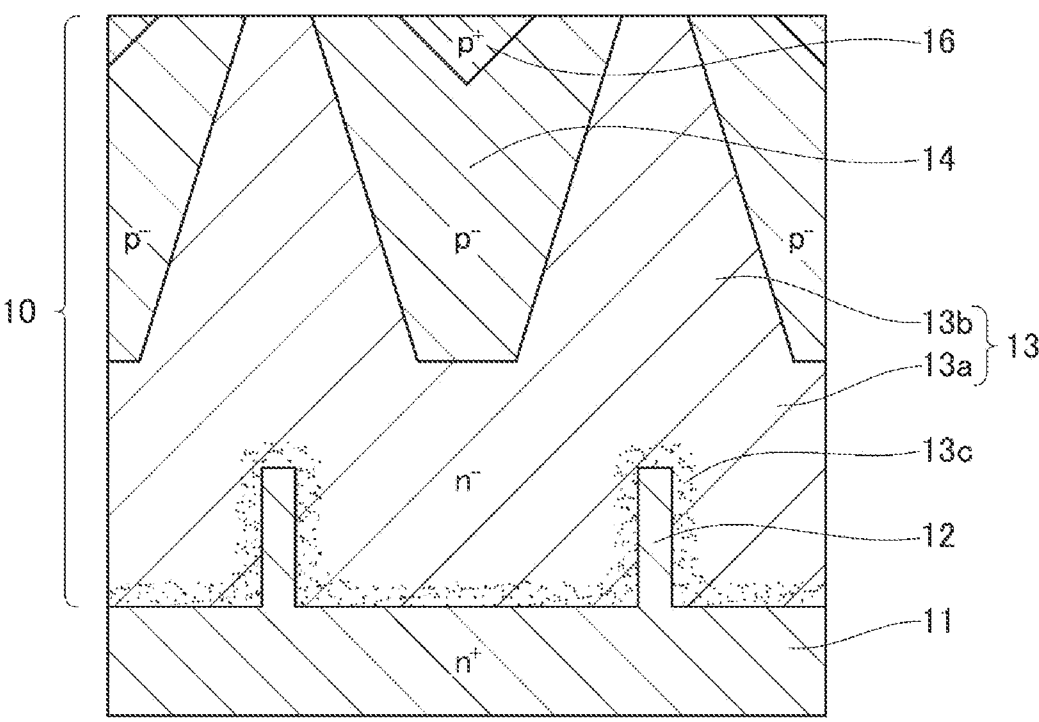
FIG. 17 is a cross-sectional view illustrating a step of manufacturing the nitride semiconductor device of FIG. 15.

Next, as shown in FIG. 17, the upper surface of the epitaxial layer 10 is planarized by CMP or anisotropic wet etching to expose the tapered region 13*b* of the drift layer 13.

Figure 18:
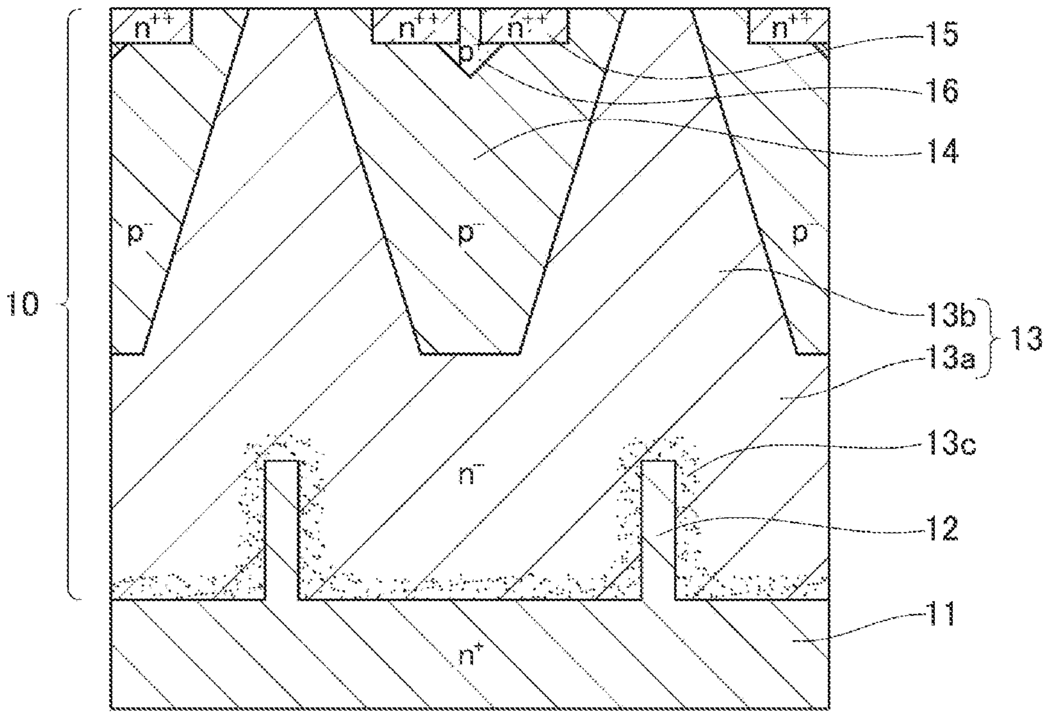
FIG. 18 is a cross-sectional view illustrating a step of manufacturing the nitride semiconductor device of FIG. 15.

Next, as shown in FIG. 18, an n-type impurity is implanted into a part of the surface of the epitaxial layer 10 by using an ion implantation technique to form a source layer 15.

Thereafter, the insulated gate 30, the interlayer insulating film 36, the drain electrode 22, and the source electrode 24 are formed by the same steps as those of the method for manufacturing the nitride semiconductor device 1, whereby the nitride semiconductor device 2 can be manufactured.

Modification

Figure 19:
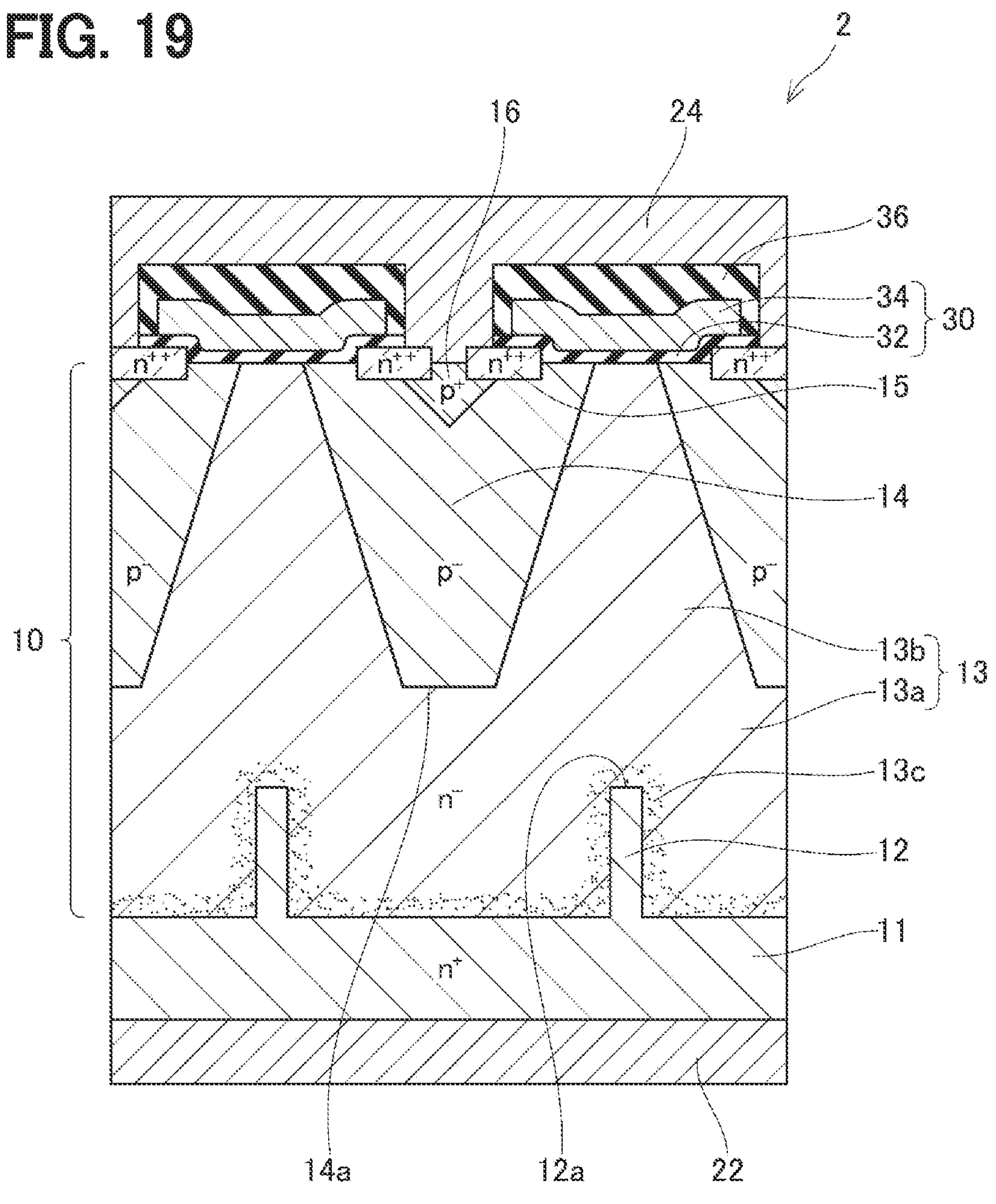
FIG. 19 is a cross-sectional view illustrating a modification of the nitride semiconductor device of FIG. 15.

As shown in FIG. 19, in a modification of the nitride semiconductor device 2, the source layer 15 is formed on a part of the upper surface of the epitaxial layer 10 by using a film forming technique instead of ion implantation. The modified nitride semiconductor device 2 can also have a high breakdown voltage similarly to the nitride semiconductor device 1.

Figure 20:
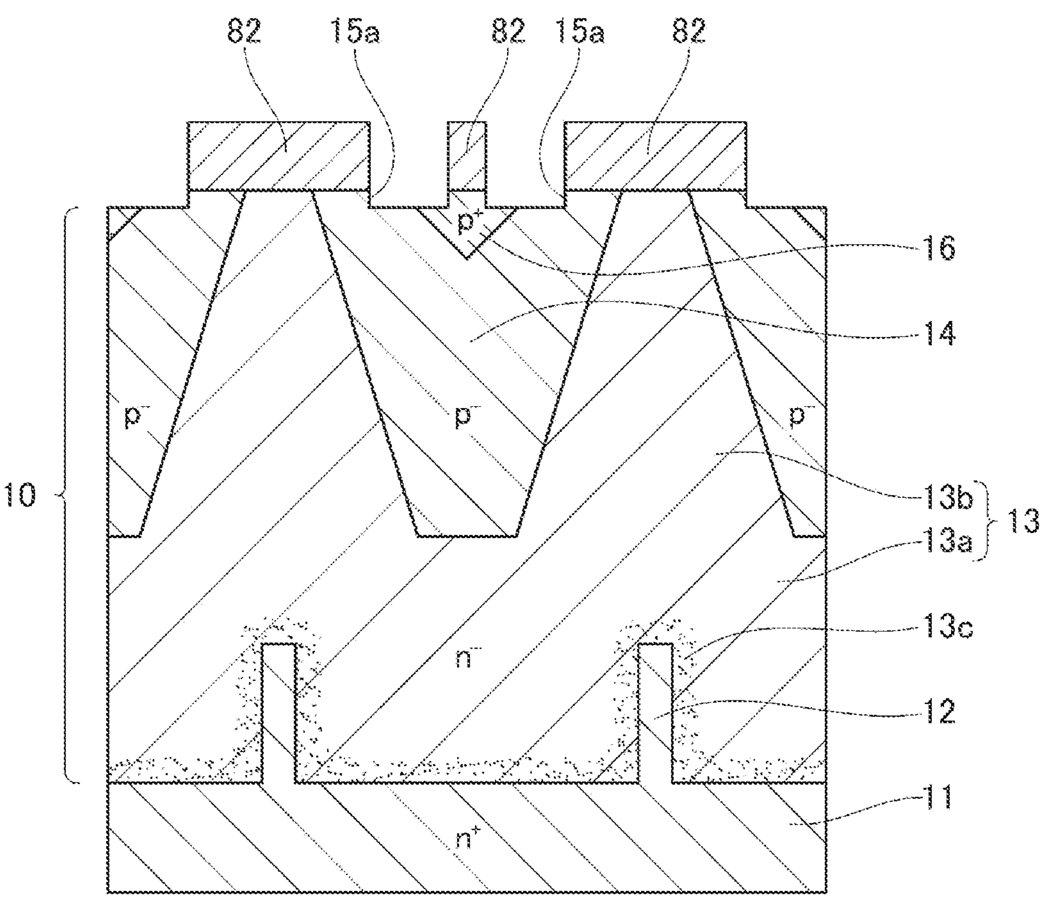
FIG. 20 is a cross-sectional view illustrating a step of manufacturing the nitride semiconductor device of FIG. 19.

The steps until the upper surface of the epitaxial layer 10 is planarized are the same as those in the method for manufacturing the nitride semiconductor device 2 (see FIGS. 16 and 17). Next, as shown in FIG. 20, a mask 82 is formed on the upper surface of the epitaxial layer 10. The mask 82 has an opening corresponding to the formation range of the source layer 15. Next, the upper surface of the epitaxial layer 10 exposed from the opening of the mask 82 is etched using an etching technique to form the recess 15*a*. The recess 15*a* is formed to improve the connection between the source layer 15 and the channel, and is not necessarily formed.

Figure 21:
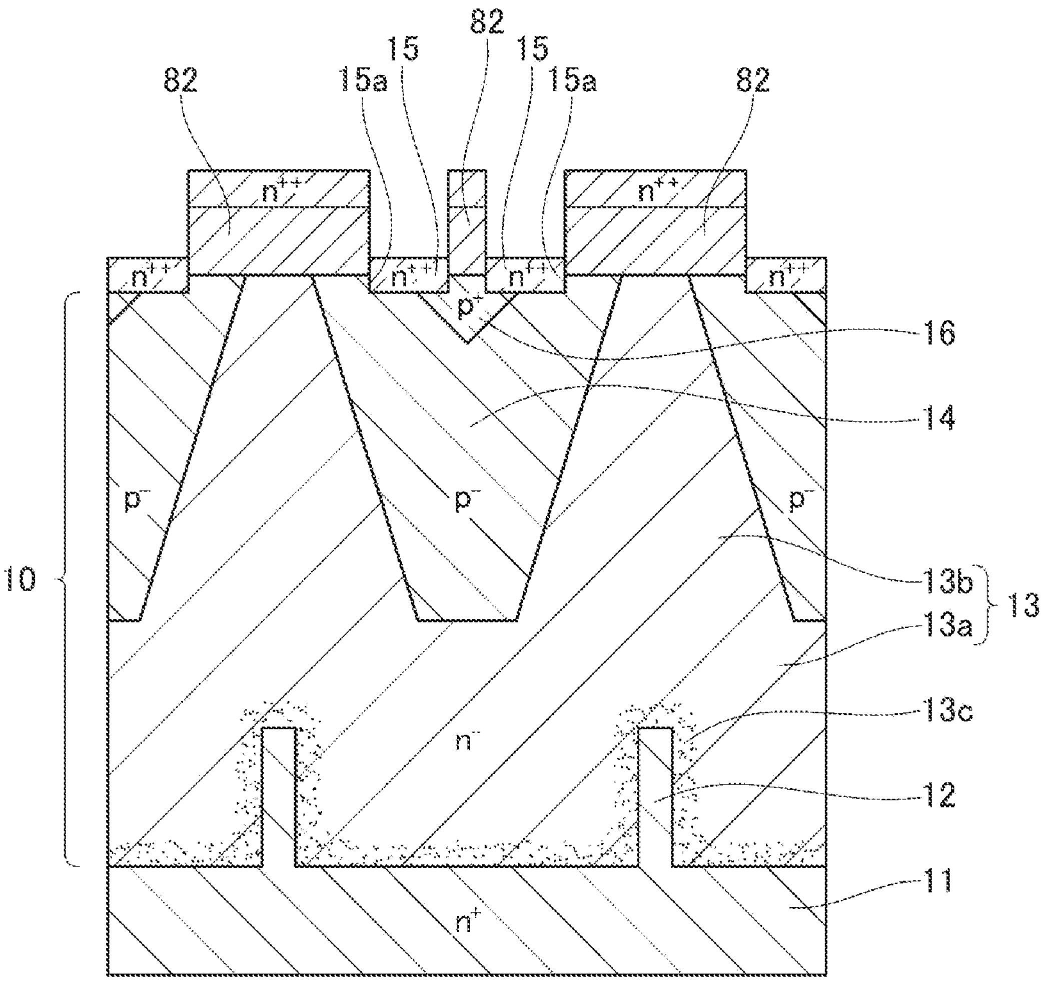
FIG. 21 is a cross-sectional view illustrating a step of manufacturing the nitride semiconductor device of FIG. 19.

Next, as shown in FIG. 21, the source layer 15 is formed using a film forming technique. The source layer 15 is formed with a predetermined thickness in the recess 15*a* of the epitaxial layer 10. Next, the mask 82 is lifted off, and the GaN deposit deposited on the mask 82 is removed. Thereafter, the modified nitride semiconductor device 2 can be manufactured by the same steps as those of the above-described manufacturing method of the nitride semiconductor device.

Third Embodiment

Figure 22:
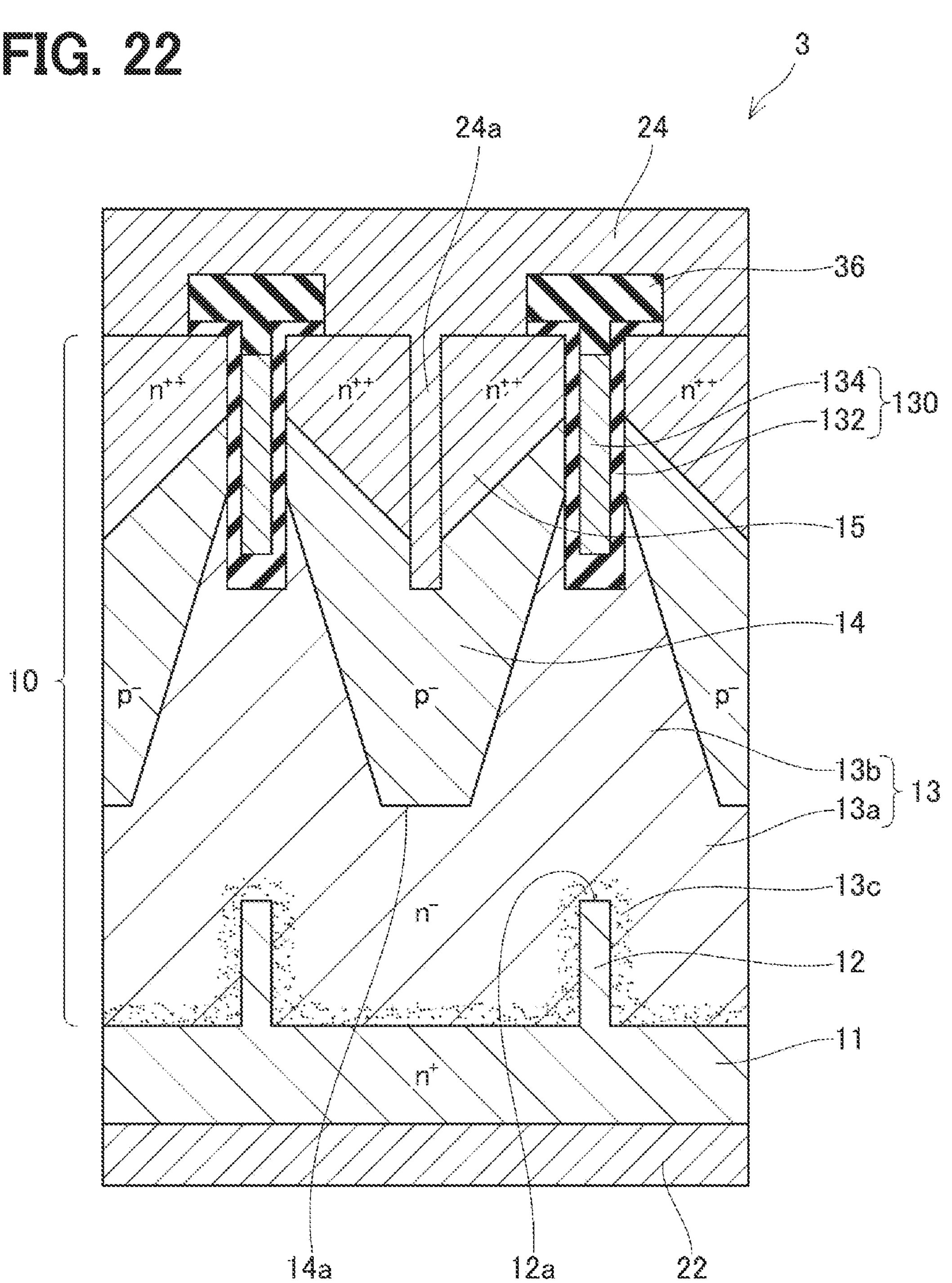
FIG. 22 is a cross-sectional view illustrating a nitride semiconductor device according to an embodiment.

As shown in FIG. 22, a nitride semiconductor device 3 includes a trench-type insulated gate 130. The insulated gate 130 is provided in a trench that penetrates the source layer 15 and the body layer 14 from the upper surface of the epitaxial layer 10 and reaches the tapered region 13*b* of the drift layer 13. The gate insulating film 132 is provided on the inner wall of the trench. The gate electrode 134 is provided in the trench and faces each of the source layer 15, the body layer 14, and the tapered region 13*b* of the drift layer 13 via the gate insulating film 132. The gate electrode 134 is insulated from the source electrode 24 by the interlayer insulating film 36. Like the nitride semiconductor device 1, the nitride semiconductor device 3 can also have a high breakdown voltage. The nitride semiconductor device 3 may also be provided with the contact layer 16 as in the nitride semiconductor device 2.

The steps up to the formation of the source layer 15 are the same as those of the method for manufacturing the nitride semiconductor device 1 (see FIGS. 2 to 7). When the source layer 15 is formed, the upper surface of the source layer 15 may be made flat by adjusting the growth temperature, the gas flow rate, the pressure, and the like, or the source layer 15 may be formed so that unevenness is formed on the upper surface of the source layer 15. Next, a trench is formed from the upper surface of the epitaxial layer 10 through the source layer 15 and the body layer 14 to reach the tapered region 13*b* of the drift layer 13 by using an etching technique. An insulated gate 130 is then formed in the trench using known fabrication techniques. The nitride semiconductor device 3 can be manufactured by the same steps as those of the above-described method for manufacturing the nitride semiconductor device. The contact portion 24*a* of the source electrode 24 may be formed simultaneously with the formation of the trench for the insulated gate 130, or may be formed in a separate step.

Fourth Embodiment

Figure 23:
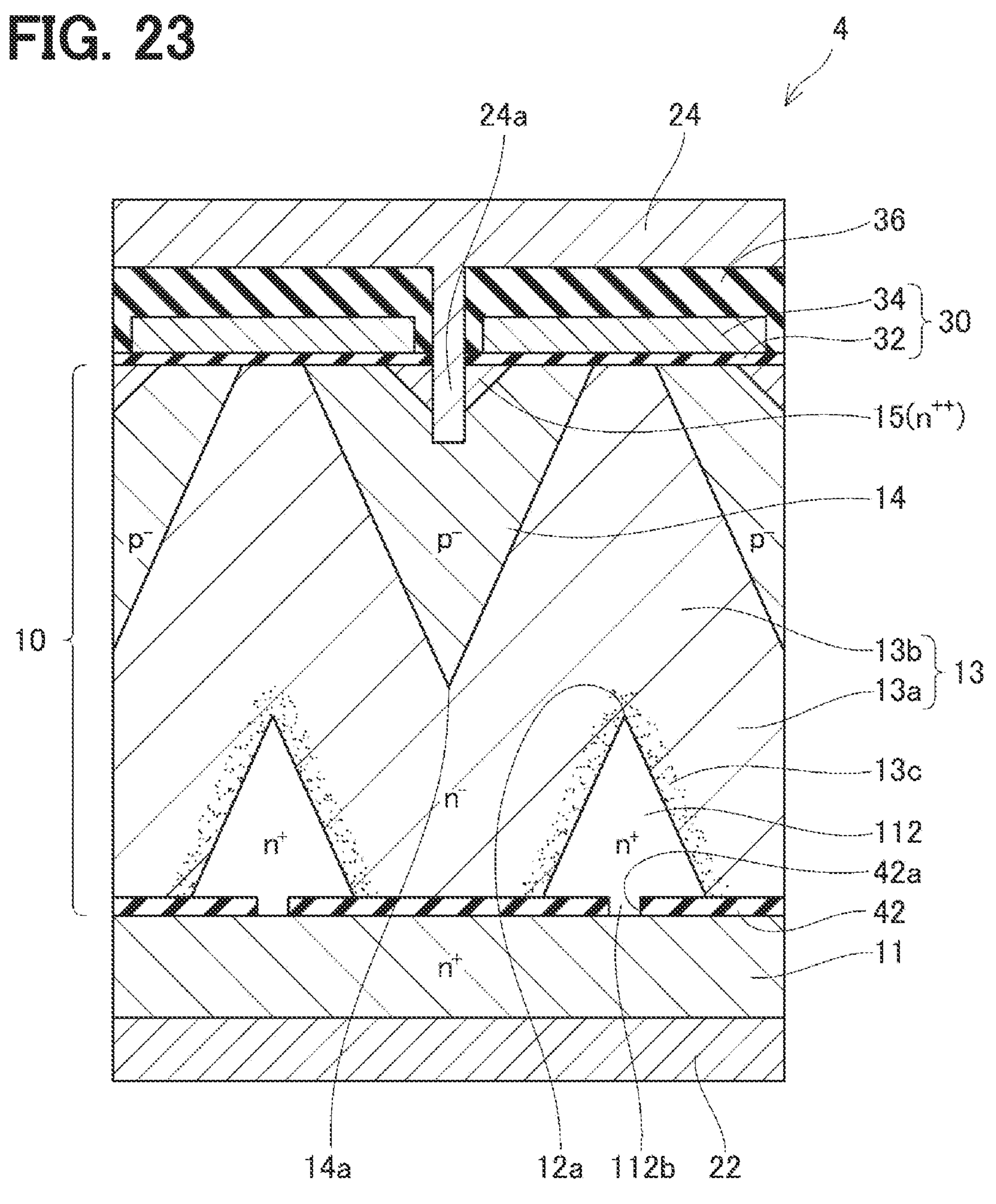
FIG. 23 is a cross-sectional view illustrating a nitride semiconductor device according to an embodiment.

As shown in FIG. 23, a nitride semiconductor device 4 includes a mask layer 42 made of an insulator at location between the nitride semiconductor layer 11 and the drift layer 13. The mask layer 42 is not particularly limited, but may be, for example, silicon oxide, silicon nitride, or DLC. An opening 42*a* is formed in the mask layer 42, and the protruding region 112 is disposed so as to pass through the opening 42*a*. The protruding region 112 is an epitaxial layer formed by crystal growth from the upper surface of the nitride semiconductor layer 11 exposed in the opening 42*a* of the mask layer 42, as will be described later in the manufacturing method. The protruding region 112 is formed wider than the opening 42*a* on the mask layer 42. In other words, the protruding region 112 has a narrow portion 112*b* at the lower end thereof, and the narrow portion 112*b* is disposed so as to pass through the opening 42*a* of the mask layer 42. In this example, the cross-section of the protruding region 112 has a triangular shape. The cross-sectional shape of the protruding region 112 can be set to various shapes depending on the growth conditions when the protruding region 112 is formed by epitaxial growth. In addition, the protruding region 112 may be formed to have a size such that adjacent protruding regions 112 are connected to each other. The n-type impurity concentration of the protruding region 112 is higher than the n-type impurity concentration of the drift layer 13. The n-type impurity concentration of the protruding region 112 is not particularly limited, but may be, for example, $1\times10^{16}$ to $1\times10^{20}$ $cm^{-3}$.

Figure 24:
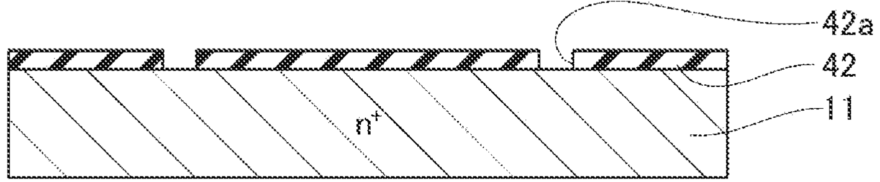
FIG. 24 is a cross-sectional view illustrating a step of manufacturing the nitride semiconductor device of FIG. 23.

A manufacturing method of the nitride semiconductor device 4 will be described. First, as shown in FIG. 24, the nitride semiconductor layer 11 which is a GaN free-standing substrate is prepared. Next, a mask layer 42 is formed on the upper surface of the nitride semiconductor layer 11 using a film forming technique. Next, a part of the mask layer 42 is removed using an etching technique to form an opening 42*a*.

Figure 25:
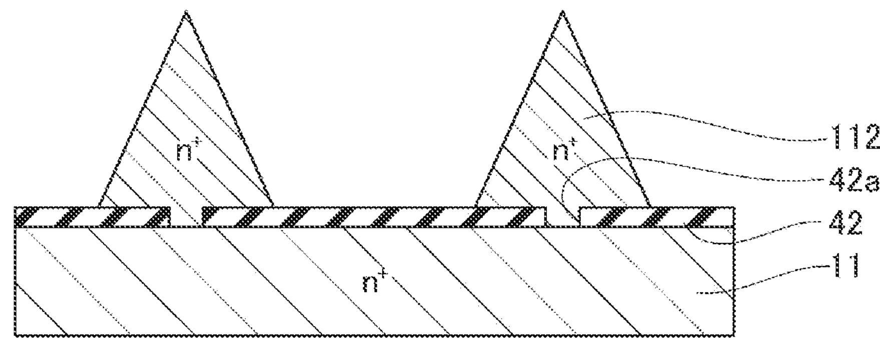
FIG. 25 is a cross-sectional view illustrating a step of manufacturing the nitride semiconductor device of FIG. 23.

Next, as shown in FIG. 25, the protruding region 112 is crystal-grown from the upper surface of the nitride semiconductor layer 11 exposed in the opening 42*a* of the mask layer 42 by using an epitaxial growth technique. As described above, depending on the growth conditions at this time, the cross-sectional shape of the protruding region 112 can be set to various shapes, and the protruding region 112 can be formed to have a size such that adjacent protruding regions 112 are connected to each other. Thereafter, the nitride semiconductor device 4 is manufactured by the same steps as those of the above-described method for manufacturing the nitride semiconductor device. According to this manufacturing method, the mask layer 42 suppresses propagation of dislocations existing in the nitride semiconductor layer 11 to the drift layer 13. Therefore, the nitride semiconductor device 4 can have low leakage current characteristics. In the nitride semiconductor device 4, the current path is blocked by the mask layer 42. However, since the n-type impurity concentration of the protruding region 112 is adjusted to be high, an increase in the on-resistance is suppressed.

Figure 26:
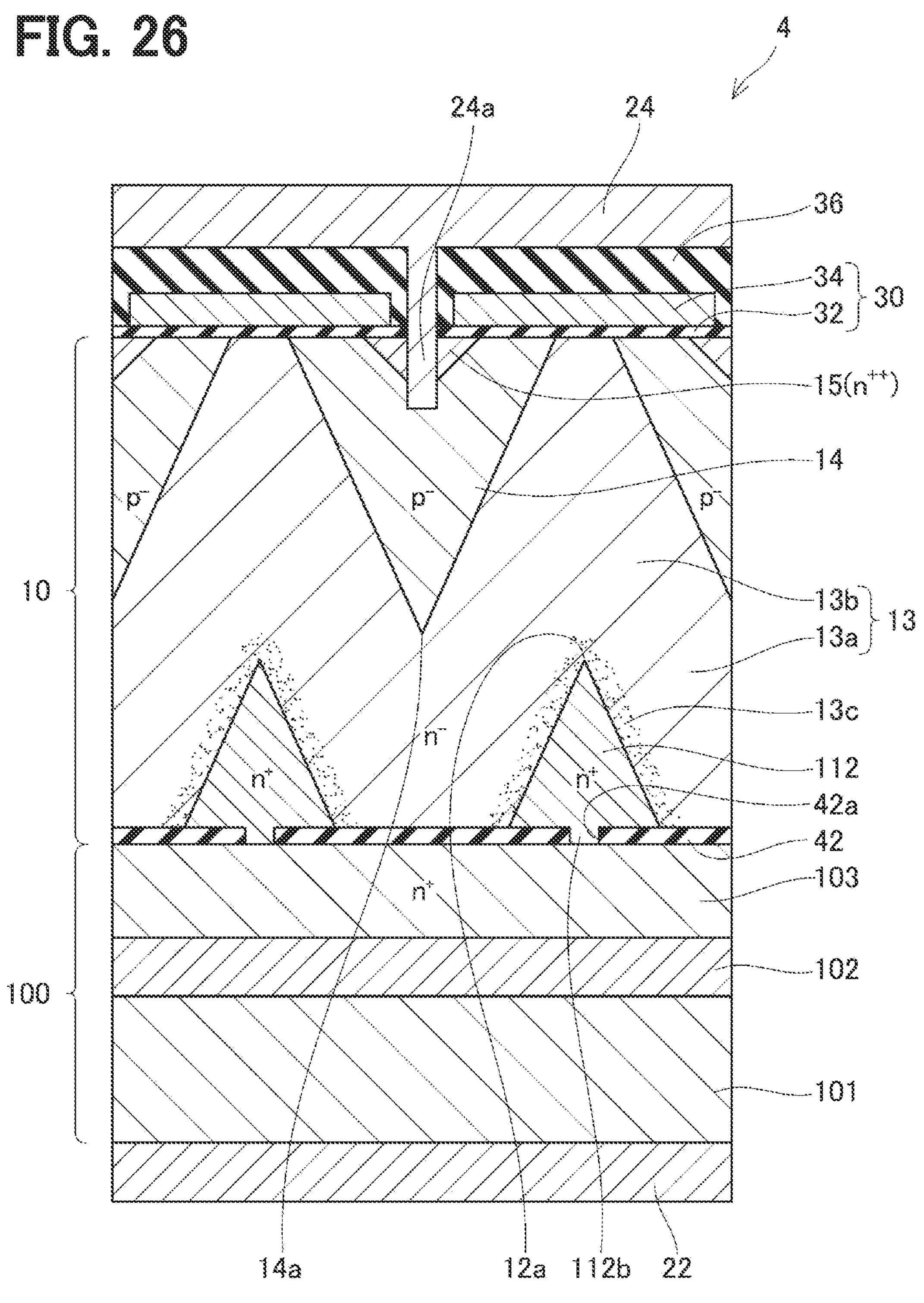
FIG. 26 is a cross-sectional view illustrating a step of manufacturing a modification of the nitride semiconductor device of FIG. 23.

The nitride semiconductor layer 11, which is a GaN free-standing substrate, is used as a base substrate. Instead of this example, as shown in FIG. 26, the nitride semiconductor device 4 may be configured using a GaN-on-Si substrate 100 as a base substrate. The GaN-on-Si substrate 100 is formed by stacking a silicon layer 101, a buffer layer 102, and a GaN layer 103, and is formed by crystal-growing the GaN layer 103 on the silicon layer 101 via the buffer layer 102. The nitride semiconductor device 4 including the mask layer 42 can suppress propagation of dislocations. Therefore, even if such a GaN-on-Si substrate 100 having many dislocations is used as a base substrate, the nitride semiconductor device 4 can have good characteristics. The same applies to a case where a GaN-on-SiC substrate or a GaN-on-sapphire substrate is used as a base substrate instead of the GaN-on-Si substrate 100. The nitride semiconductor device 4 can be manufactured at low cost by using the GaN-on-Si substrate, the GaN-on-SiC substrate, or the GaN-on-sapphire substrate as the base substrate.

Figure 27:
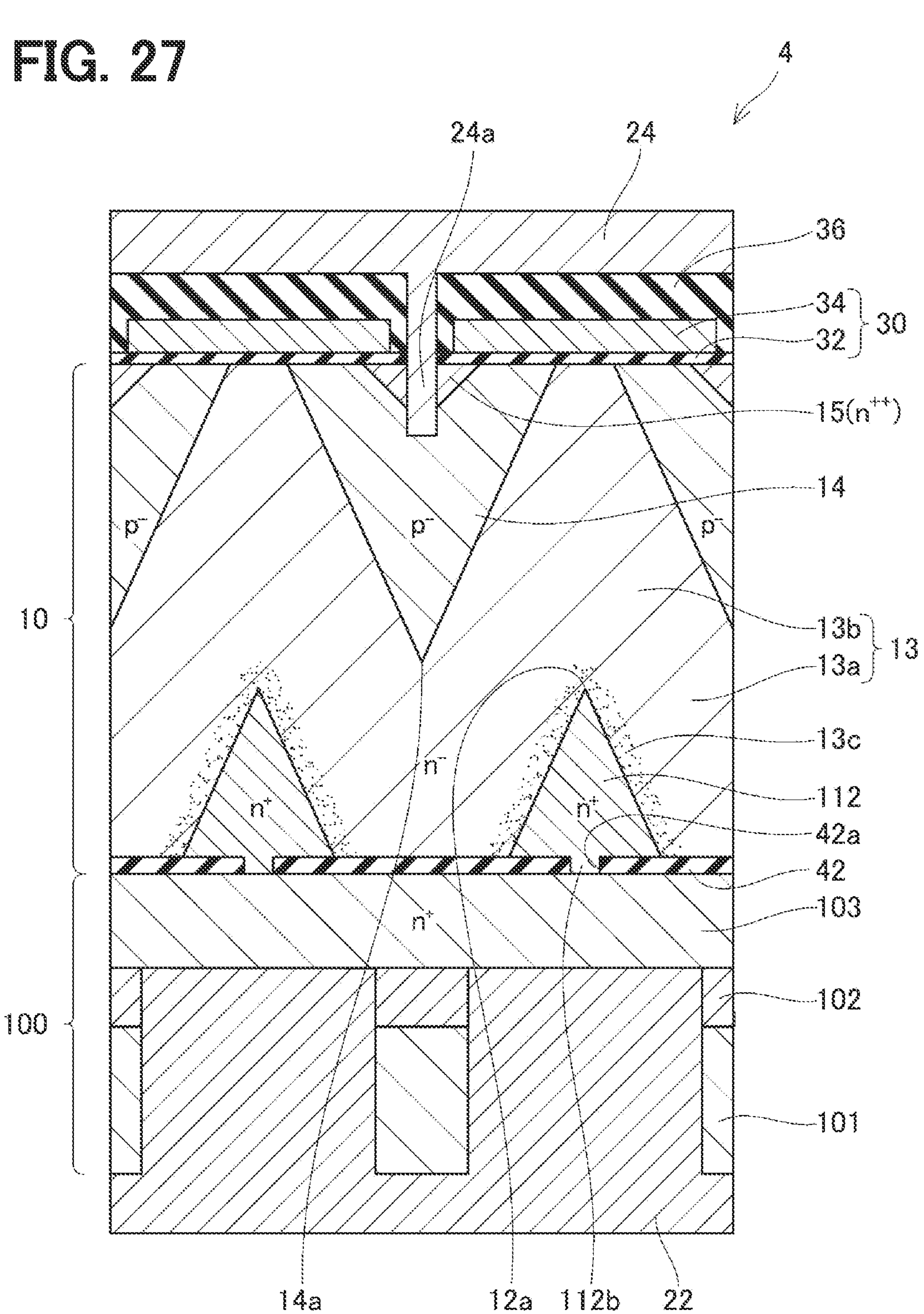
FIG. 27 is a cross-sectional view illustrating a step of manufacturing a modification of the nitride semiconductor device of FIG. 23.

The buffer layer 102 of the GaN-on-Si substrate 100 has a high resistance. Therefore, as shown in FIG. 27, the silicon layer 101 and the buffer layer 102 may be partially removed by an etching technique so that the drain electrode 22 is in contact with the GaN layer 103. In this case, the silicon layer 101 and the buffer layer 102 may be partially removed so that the drain electrode 22 is disposed below the opening 42*a* of the mask layer 42. In this example, since the drain electrode 22 is disposed corresponding to the current path passing through the opening 42*a* of the mask layer 42, the effect of reducing the resistance is high. The remaining silicon layer 101 and the buffer layer 102 can reduce resistance while ensuring strength during wafer handling.

Figure 28:
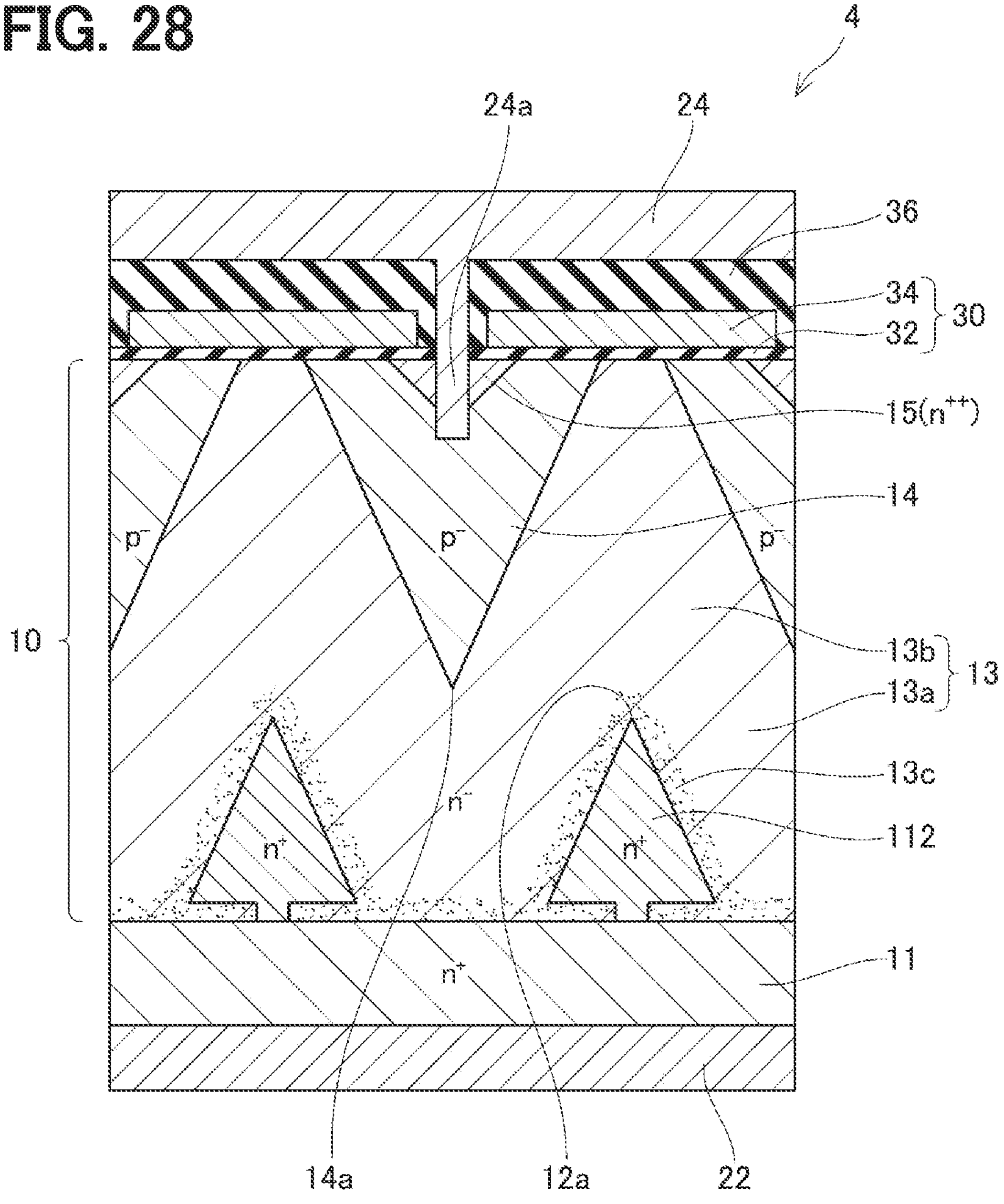
FIG. 28 is a cross-sectional view illustrating a step of manufacturing a modification of the nitride semiconductor device of FIG. 23.

As shown in FIG. 28, in the nitride semiconductor device 4, the mask layer 42 may be removed. As shown in FIG. 25, the nitride semiconductor device 4 is manufactured by removing the mask layer 42 using an etching technique after forming the protruding region 112 and before forming the drift layer 13.

Fifth Embodiment

Figure 29:
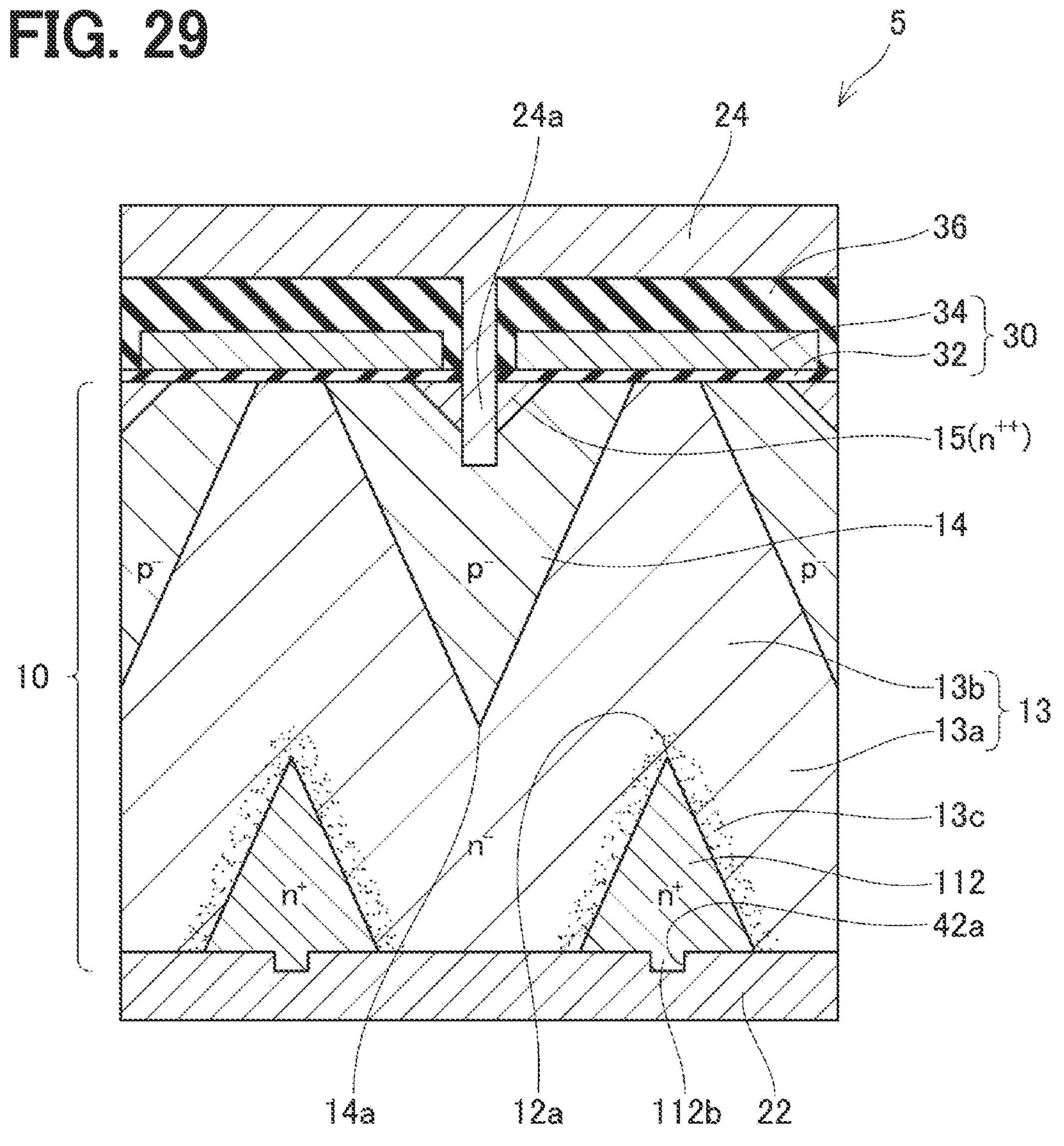
FIG. 29 is a cross-sectional view illustrating a nitride semiconductor device according to an embodiment.

As shown in FIG. 29, in the nitride semiconductor device 5, the nitride semiconductor layer 11 is removed. A protruding region 112 is provided on a part of the upper surface of the drain electrode 22. The drift layer 13 is provided to cover the protruding region 112 and to be in contact with the upper surface of the drain electrode 22. The drain electrode 22 is an example of a conductive layer.

Figure 30:
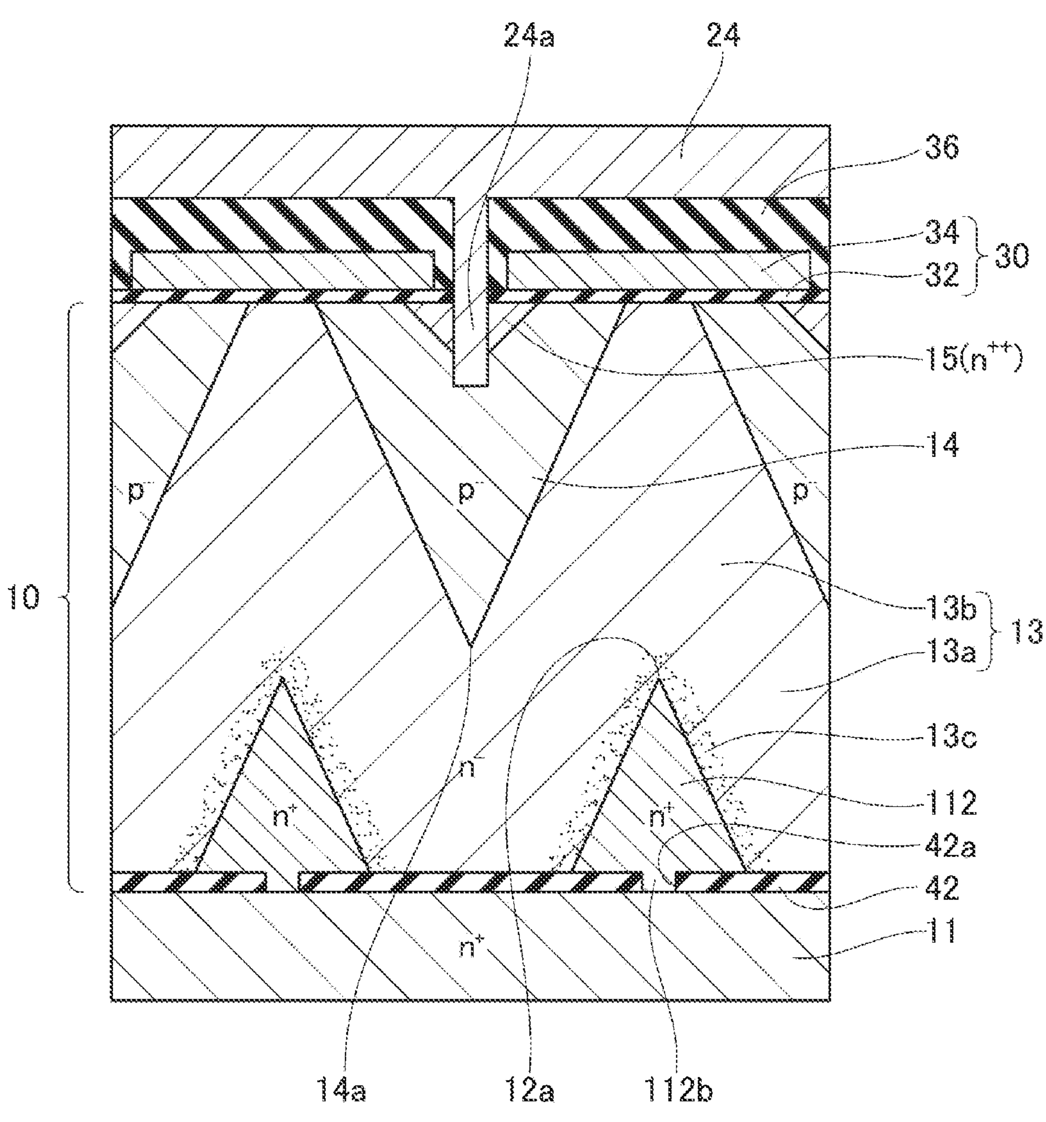
FIG. 30 is a cross-sectional view illustrating a step of manufacturing the nitride semiconductor device of FIG. 29.

As shown in FIG. 30, the steps of forming various structures on the nitride semiconductor layer 11 are the same as those in the method of manufacturing the nitride semiconductor device 4.

Figure 31:
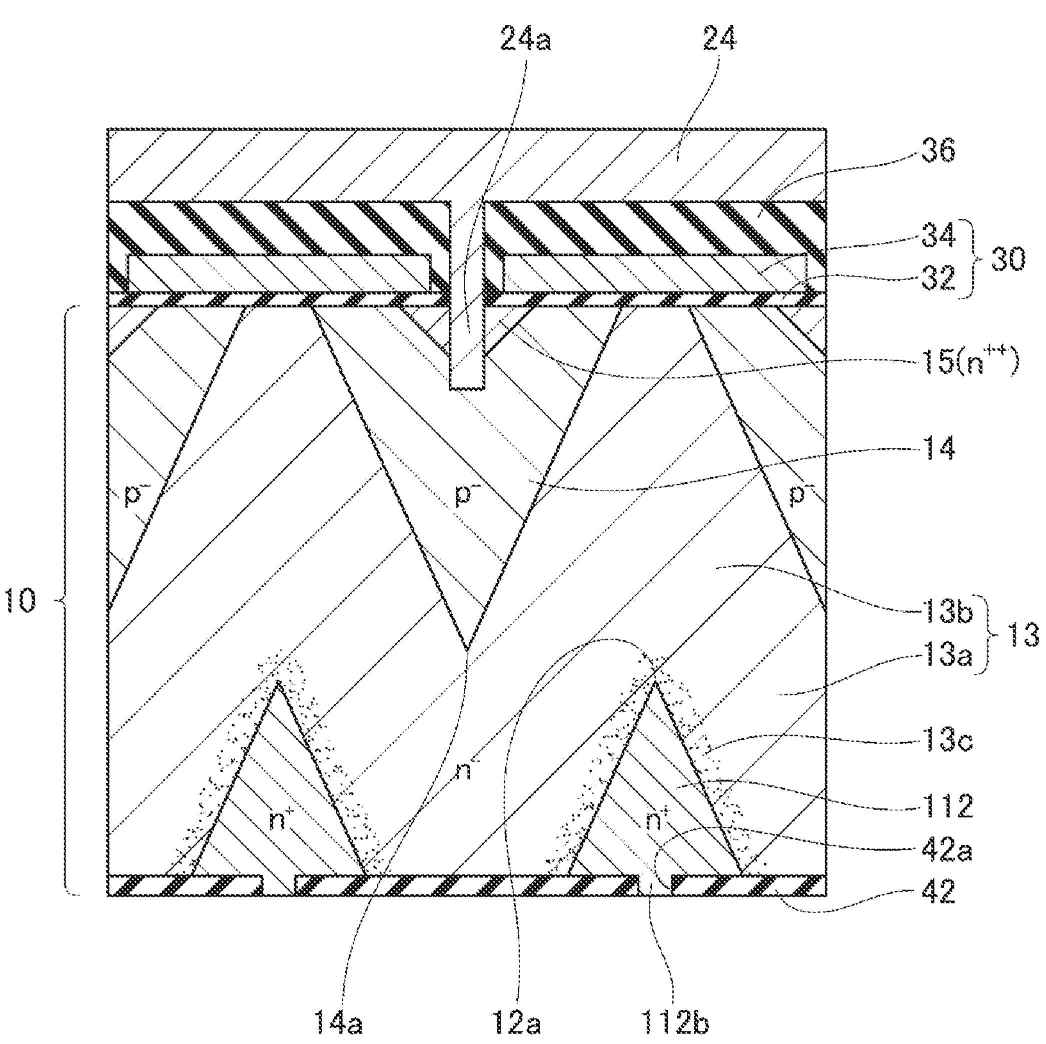
FIG. 31 is a cross-sectional view illustrating a step of manufacturing the nitride semiconductor device of FIG. 29.

Next, as shown in FIG. 31, the nitride semiconductor layer 11 is removed using a CMP technique, a wet etching technique, or a laser peeling technique.

Figure 32:
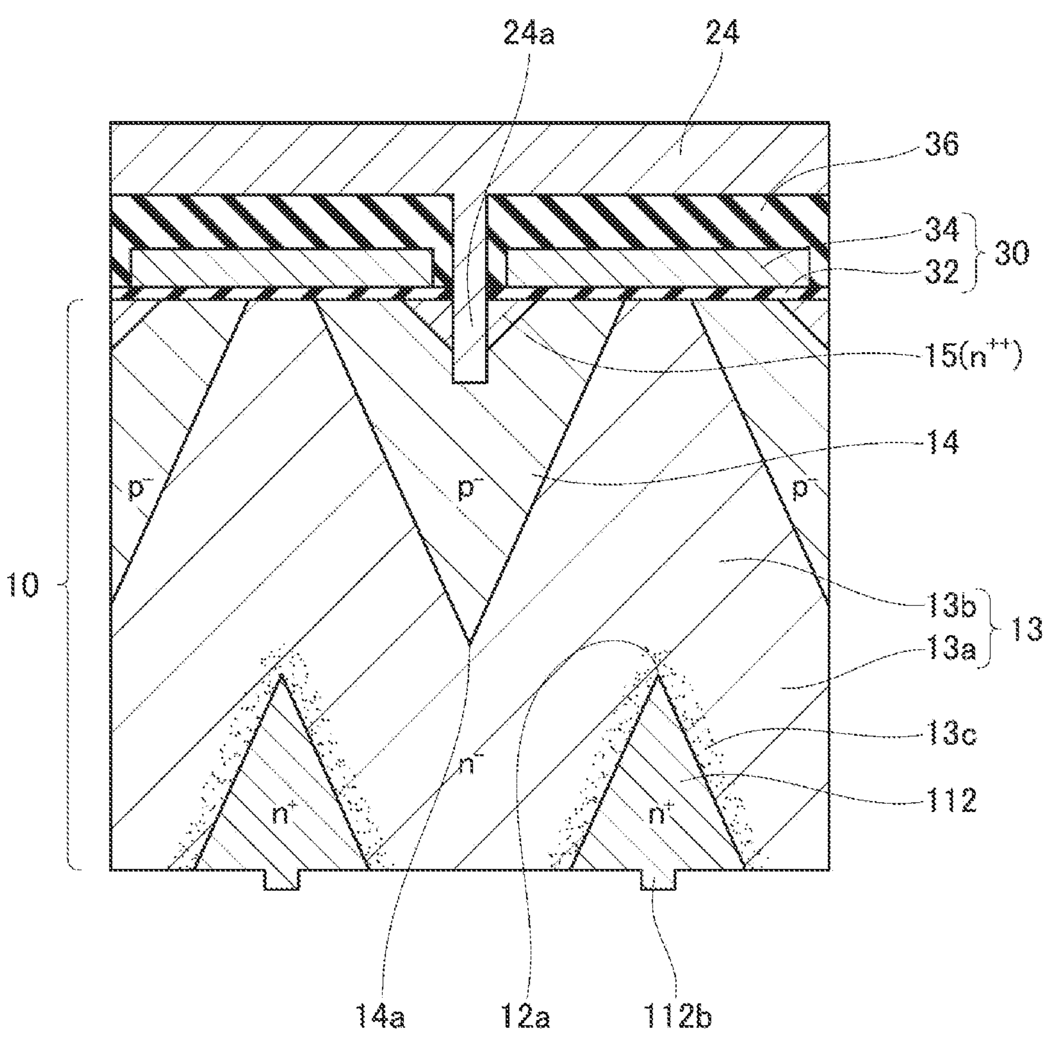
FIG. 32 is a cross-sectional view illustrating a step of manufacturing the nitride semiconductor device of FIG. 29.

Next, as shown in FIG. 32, the mask layer 42 is removed by wet etching.

Thereafter, the nitride semiconductor device 5 is manufactured by forming the drain electrode 22 on the lower surface of the drift layer 13 and the protruding region 112.

Like the nitride semiconductor device 4, the nitride semiconductor device 5 can also be manufactured using a GaN-on-Si substrate, a GaN-on-SiC substrate, or a GaN-on-sapphire substrate as a base substrate. In the nitride semiconductor device 5, since the GaN-on-Si substrate, the GaN-on-SiC substrate, or the GaN-on-sapphire substrate is finally removed, there is no high-resistance buffer layer. The nitride semiconductor device 5 in which the GaN-on-Si substrate, the GaN-on-SiC substrate, or the GaN-on-sapphire substrate is used as the base substrate has low on-resistance and can be manufactured at low cost.

The nitride semiconductor device of each embodiment can be modified as described below.

Figure 33:
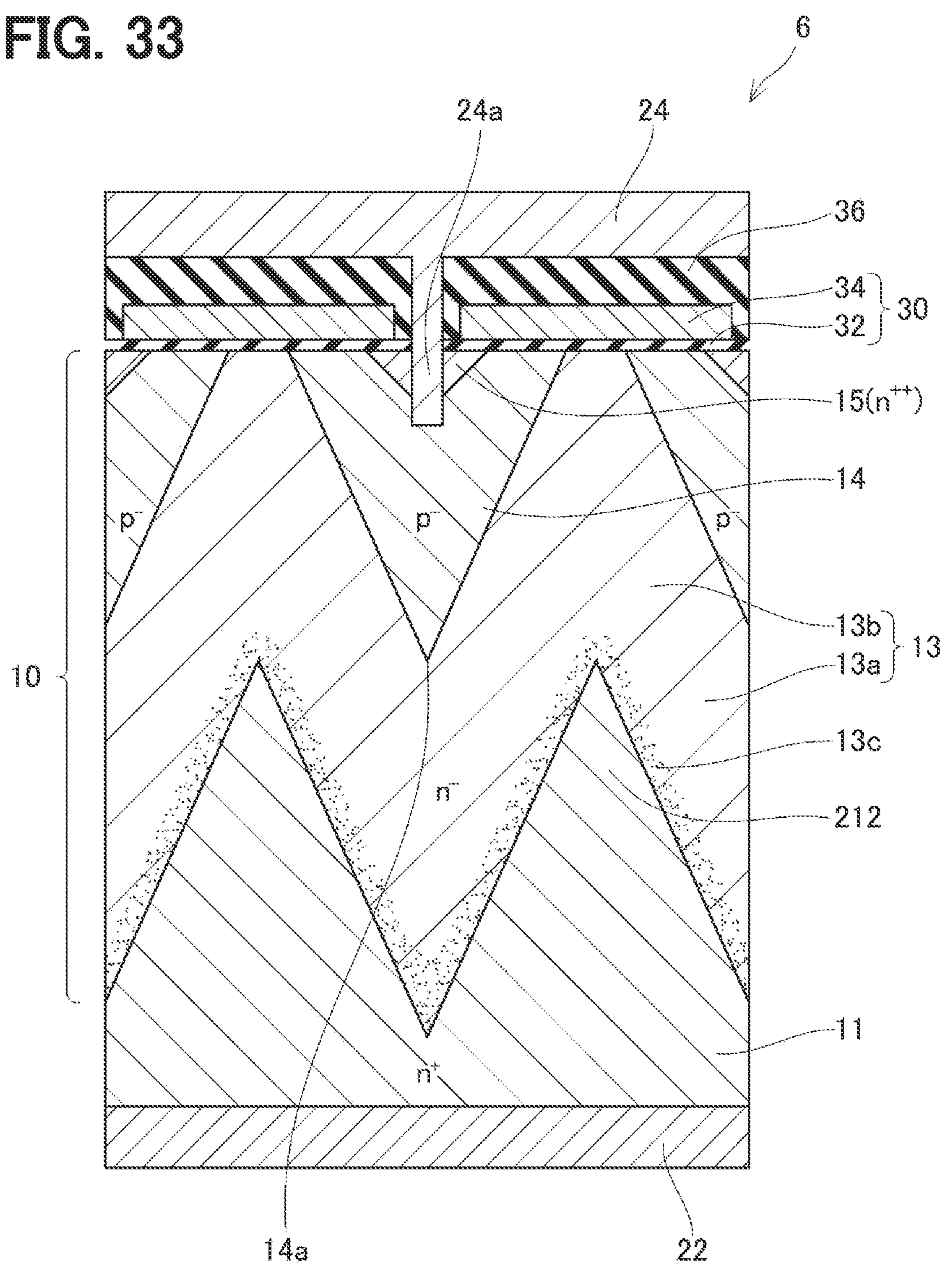
FIG. 33 is a cross-sectional view illustrating a nitride semiconductor device according to an embodiment.

The cross-sectional shape of the protruding region 12, 112 is not particularly limited, and may be, for example, a trapezoidal shape, a semicircular shape, or a triangular shape. Further, as in a nitride semiconductor device 6 shown in FIG. 33, adjacent protruding regions 212 may be connected to each other. That is, the upper surface of the nitride semiconductor layer 11 may not have a flat surface, and the protruding region 212 may be formed on the entire upper surface of the nitride semiconductor layer 11.

Figure 34:
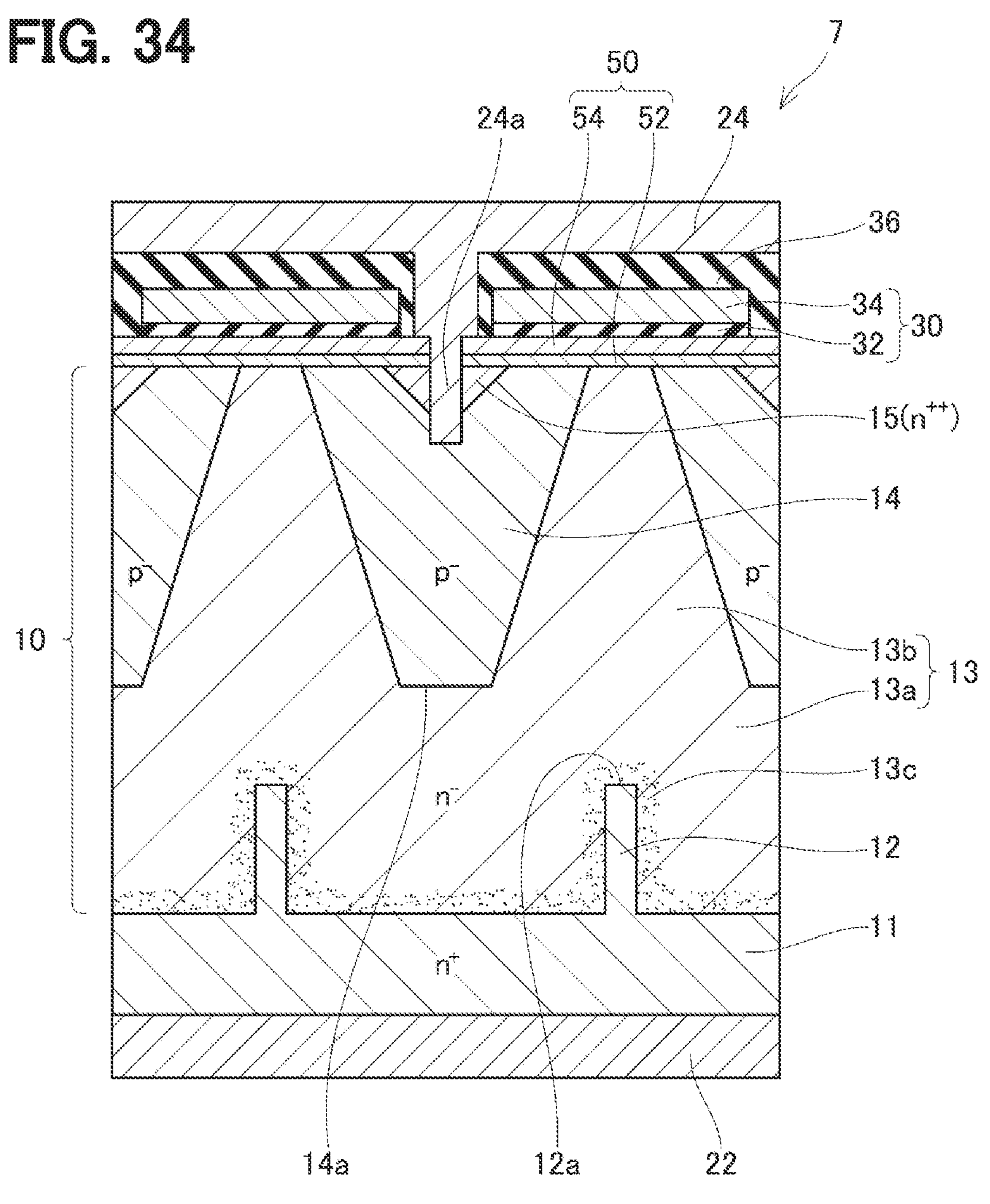
FIG. 34 is a cross-sectional view illustrating a nitride semiconductor device according to an embodiment.

In each of the embodiments, the inversion layer formed in the body layer 14 serves as a channel. Instead of this example, the technology disclosed in the present specification can also be applied to a structure in which a two-dimensional electron gas layer serves as a channel. A nitride semiconductor device 7 shown in FIG. 34 includes a heterojunction layer 50 between the planar insulated gate 30 and the epitaxial layer 10. The heterojunction layer 50 includes a lower nitride semiconductor layer 52 and an upper nitride semiconductor layer 54. The lower nitride semiconductor layer 52 is in contact with the upper surface of the epitaxial layer 10. The lower nitride semiconductor layer 52 may be, for example, gallium nitride. The upper nitride semiconductor layer 54 is in contact with the lower nitride semiconductor layer 52, and faces the upper surface of the epitaxial layer 10 via the lower nitride semiconductor layer 52. The upper nitride semiconductor layer 54 is a nitride semiconductor having a wider band gap than the lower nitride semiconductor layer 52, and may be, for example, aluminum gallium nitride. As a result, a two-dimensional electron gas layer is formed in the vicinity of the heterojunction interface between the lower nitride semiconductor layer 52 and the upper nitride semiconductor layer 54. The electron density of the two-dimensional electron gas layer can be controlled by a voltage applied to the gate electrode 34. As described above, the nitride semiconductor device 7 has a structure in which the two-dimensional electron gas layer serves as a channel, and can operate as a switching element. In the nitride semiconductor device 7, a channel of an inversion layer is not formed in the body layer 14. Therefore, in the nitride semiconductor device 7, the concentration of the p-type impurity in the body layer 14 may be higher than in the other examples. The gate insulating film 32 of the insulated gate 30 may be replaced with a p-type nitride semiconductor. The nitride semiconductor device in this case can also have similar functions.

Figure 35:
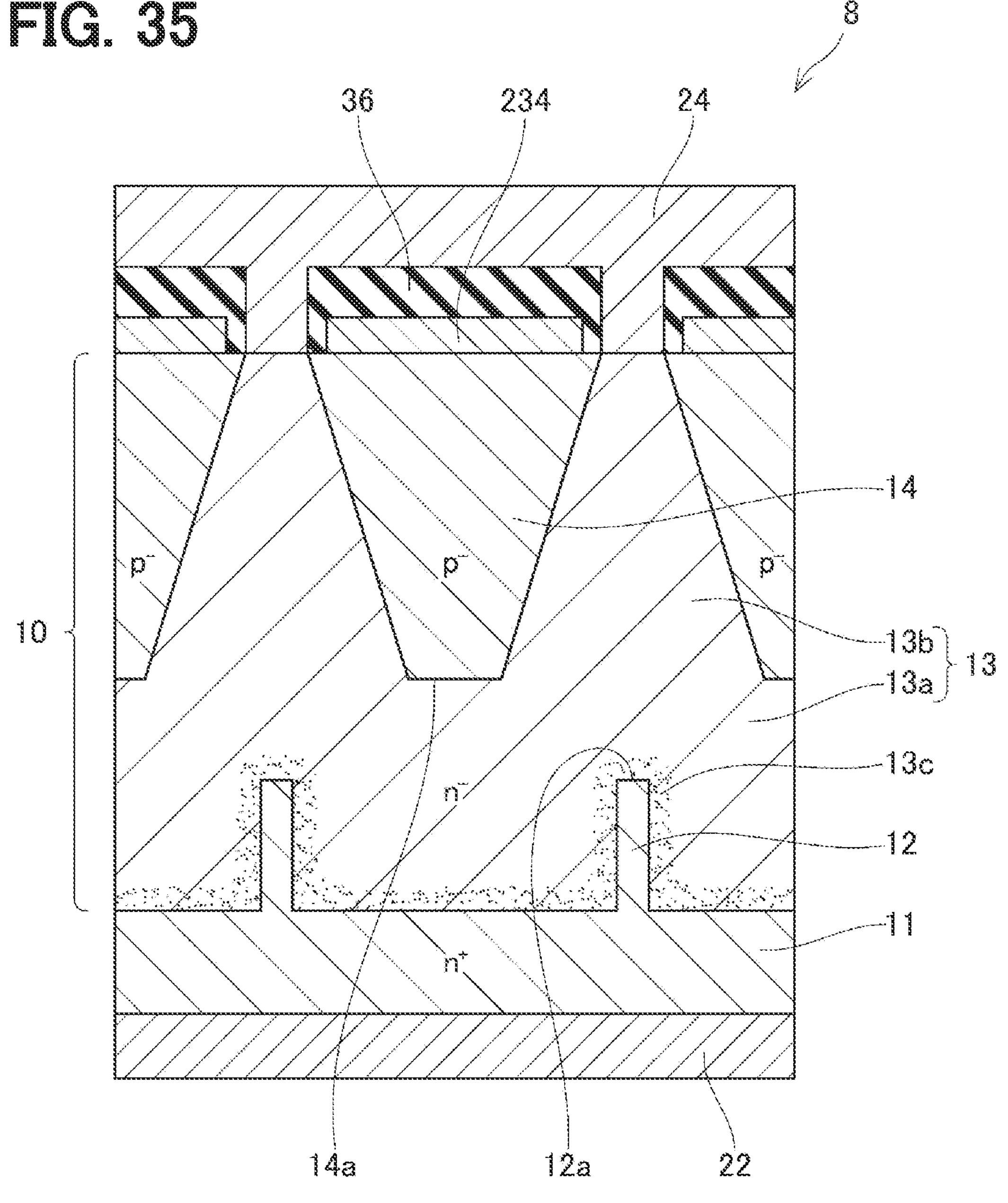
FIG. 35 is a cross-sectional view illustrating a nitride semiconductor device according to an embodiment.

The technique disclosed in the present specification can also be applied to a nitride semiconductor device 8 shown in FIG. 35. The nitride semiconductor device 8 has the gate electrode 234 in ohmic contact with the upper surface of the body layer 14. In the nitride semiconductor device 8, the width of the depletion layer formed in the pn junction between the tapered region 13*b* of the drift layer 13 and the body layer 14 can be controlled based on the voltage applied to the gate electrode 234. Thus, the current density flowing through the tapered region 13*b* of the drift layer 13 can be controlled based on the voltage applied to the gate electrode 234. The nitride semiconductor device 8 can operate as a switching element. In the nitride semiconductor device 8, as in the nitride semiconductor device 7, a channel of an inversion layer is not formed in the body layer 14. Therefore, also in the nitride semiconductor device 8, the concentration of the p-type impurity in the body layer 14 may be increased as compared with the other examples.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A nitride semiconductor device comprising:

a conductive layer;

a protruding region of a nitride semiconductor provided on at least a part of an upper surface of the conductive layer;

an n-type drift layer provided above the conductive layer, the drift layer including a tapered region tapered upward above the protruding region; and a p-type body layer adjacent to the tapered region of the drift layer, wherein the drift layer and the body layer are an epitaxial layer, the conductive layer is an n-type nitride semiconductor layer, an n-type impurity concentration of the drift layer is lower than an n-type impurity concentration of the nitride semiconductor layer, and the protruding region is formed by a part of the nitride semiconductor layer.

2. The nitride semiconductor device according to claim 1, wherein the protruding region has a narrow portion at a lower end of the protruding region.

3. The nitride semiconductor device according to claim 2, further comprising: a mask layer provided on the upper surface of the conductive layer and having an opening, wherein the narrow portion of the protruding region is disposed through the opening.

4. The nitride semiconductor device according to claim 3, wherein the protruding region has an n-type impurity concentration higher than that of the drift layer.

5. The nitride semiconductor device according to claim 1, wherein a lower end of the body layer is located above an upper end of the protruding region.

6. A method of manufacturing a nitride semiconductor device, comprising:

forming a protruding region by etching an upper surface of an n-type nitride semiconductor layer;

forming an n-type drift layer having an n-type impurity concentration lower than that of the nitride semiconductor layer by crystal growth from the upper surface of the nitride semiconductor layer, the drift layer being provided above the nitride semiconductor layer and including a tapered region tapered upward above the protruding region; and forming a p-type body layer by crystal growth from an upper surface of the drift layer, the body layer being adjacent to the tapered region of the drift layer.

7. A method of manufacturing a nitride semiconductor device, comprising:

forming a mask layer on an upper surface of a nitride semiconductor layer, the mask layer having an opening;

forming a protruding region by crystal growth from the upper surface of the nitride semiconductor layer exposed from the opening of the mask layer;

removing the mask layer;

forming an n-type drift layer by crystal growth from the upper surface of the nitride semiconductor layer, the drift layer being provided above the nitride semiconductor layer and including a tapered region tapered upward above the protruding region; and forming a p-type body layer by crystal growth from an upper surface of the drift layer, the body layer being adjacent to the tapered region of the drift layer.

8. A method of manufacturing a nitride semiconductor device, comprising:

forming a mask layer on an upper surface of a nitride semiconductor layer, the mask layer having an opening;

forming a protruding region by crystal growth from the upper surface of the nitride semiconductor layer exposed from the opening of the mask layer;

forming an n-type drift layer by crystal growth from the protruding region, the drift layer being provided above the nitride semiconductor layer and including a tapered region tapered upward above the protruding region; and forming a p-type body layer by crystal growth from an upper surface of the drift layer, the body layer being adjacent to the tapered region of the drift layer.

9. The method according to claim 6, further comprising:

forming an n-type source layer by crystal growth from an upper surface of the body layer.

10. The method according to claim 6, further comprising:

forming a p-type contact layer by crystal growth from an upper surface of the body layer.

11. The method according to claim 7, wherein the protruding region has an n-type impurity concentration higher than that of the drift layer.

12. The method according to claim 6, wherein a lower end of the body layer is located above an upper end of the protruding region.

* * * * *